(12) United States Patent
Kim et al.

(10) Patent No.: US 11,342,486 B2
(45) Date of Patent: May 24, 2022

(54) LIGHT-EMITTING DEVICE PACKAGE AND LIGHTING DEVICE HAVING SAME

(71) Applicant: SUZHOU LEKIN SEMICONDUCTOR CO., LTD., Taicang (CN)

(72) Inventors: Ki Seok Kim, Seoul (KR); Jung Hwa Jung, Seoul (KR); Na Young Kim, Seoul (KR); Won Jung Kim, Seoul (KR); Suk Kyung Park, Seoul (KR); Sang Jun Lee, Seoul (KR); Nak Hun Kim, Seoul (KR); Chang Man Lim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 0 days.

(21) Appl. No.: 16/759,907

(22) PCT Filed: Oct. 31, 2018

(86) PCT No.: PCT/KR2018/013118
§ 371 (c)(1),
(2) Date: Apr. 28, 2020

(87) PCT Pub. No.: WO2019/088704
PCT Pub. Date: May 9, 2019

(65) Prior Publication Data
US 2020/0335673 A1    Oct. 22, 2020

(30) Foreign Application Priority Data

Oct. 31, 2017 (KR) .................. 10-2017-0144021
Oct. 26, 2018 (KR) .................. 10-2018-0128960

(51) Int. Cl.
*H01L 33/54* (2010.01)
*H01L 33/50* (2010.01)
(Continued)

(52) U.S. Cl.
CPC ............ *H01L 33/54* (2013.01); *H01L 33/505* (2013.01); *H01L 33/60* (2013.01); *H01L 33/486* (2013.01);
(Continued)

(58) Field of Classification Search
CPC ..... H01L 33/505; H01L 33/50; H01L 33/501; H01L 33/502; H01L 33/504;
(Continued)

(56) References Cited

U.S. PATENT DOCUMENTS

2010/0123386 A1    5/2010 Chen
2011/0309388 A1   12/2011 Ito et al.
(Continued)

FOREIGN PATENT DOCUMENTS

| JP | 2012-004303 | 1/2012 |
| KR | 10-2012-0048995 | 5/2012 |
| KR | 10-1575655 | 12/2015 |

OTHER PUBLICATIONS

International Search Report dated Feb. 14, 2019 issued in Application No. PCT/KR2018/013118.

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

A light emitting device package disclosed in an embodiment of the invention includes a substrate including first and second frames; a light emitting device including a first bonding portion facing the first frame and a second bonding portion facing the second frame; a phosphor layer on the
(Continued)

light emitting device; a first resin disposed around the upper surface of the substrate and the light emitting device; a second resin between the first resin and side surfaces of the light emitting device; and an adhesive layer between the phosphor layer and the light emitting device, wherein the adhesive layer includes a thickness thinner than a thickness of the phosphor layer, and the first resin comprises a reflective resin material and is disposed on the side surface of the phosphor layer. The second resin may include a transparent resin material, and the second resin may include a curved surface with an outer surface facing the first resin.

18 Claims, 18 Drawing Sheets

(51) Int. Cl.
*H01L 33/60* (2010.01)
*H01L 33/48* (2010.01)
*H01L 33/56* (2010.01)
*H01L 33/62* (2010.01)
*H01L 33/58* (2010.01)
*H01L 33/36* (2010.01)

(52) U.S. Cl.
CPC ............. *H01L 33/56* (2013.01); *H01L 33/62* (2013.01); *H01L 2933/005* (2013.01); *H01L 2933/0041* (2013.01)

(58) Field of Classification Search
CPC . H01L 2933/0041; H01L 33/54; H01L 33/60; H01L 33/483; H01L 33/486
See application file for complete search history.

(56) References Cited

U.S. PATENT DOCUMENTS

| | | |
|---|---|---|
| 2012/0115261 A1 | 5/2012 | Kwon |
| 2014/0070238 A1* | 3/2014 | Kim ..................... H01L 33/46 257/88 |
| 2015/0001563 A1 | 1/2015 | Miki |
| 2015/0129918 A1* | 5/2015 | Ikegami ............... H01L 33/507 257/98 |
| 2017/0062671 A1* | 3/2017 | Hashimoto .......... H01L 33/005 |
| 2017/0084587 A1* | 3/2017 | Hung ................... H01L 33/60 |
| 2018/0103513 A1* | 4/2018 | Tseng .................. H01L 25/0753 |

\* cited by examiner

LIGHT-EMITTING DEVICE PACKAGE AND LIGHTING DEVICE HAVING SAME

CROSS-REFERENCE TO RELATED PATENT APPLICATIONS

This application is a U.S. National Stage Application under 35 U.S.C. § 371 of PCT Application No. PCT/KR2018/013118, filed Oct. 31, 2018, which claims priority to Korean Patent Application Nos. 10-2017-0144021, filed Oct. 31, 2017 and 10-2018-0128960, filed Oct. 26, 2018, whose entire disclosures are hereby incorporated by reference.

FIELD OF THE INVENTION

An embodiment of the invention relates to a light emitting device package and a lighting device having the same.

An embodiment of the invention relates to a method of manufacturing a light emitting device package.

BACKGROUND ART

A light emitting device, such as a light emitting diode (LED), is a type of semiconductor device that converts electrical energy into light, and has been spotlighted as a next-generation light source by replacing conventional fluorescent lamps and incandescent lamps.

Since a light emitting diode generates light using a semiconductor device, it consumes very low power compared to an incandescent lamp that generates light by heating tungsten or a fluorescent lamp that generates light by colliding ultraviolet light generated through high-pressure discharge to a phosphor.

In addition, since the light emitting diode generates light using a potential gap of a semiconductor device, it has a longer life span, faster response characteristics, and eco-friendly characteristics than conventional light sources.

Accordingly, many studies are being conducted to replace the existing light sources with light emitting diodes, and the light emitting diodes are increasingly used as a light source for lighting devices such as various lamps, liquid crystal displays, electric signboards, street lights, tail lights, interior lights, headlights used indoors and outdoors.

SUMMARY OF THE INVENTION

An embodiment of the invention provides a light emitting device package in which a second resin is disposed between a light emitting device and a first resin.

An embodiment of the invention provides a light emitting device package in which a second resin formed of a transparent material is disposed between a side surface of the light emitting device and a first resin formed of a reflective material, and a method for manufacturing the same.

An embodiment of the invention provides a light emitting device package in which a second resin formed of a transparent material and a first resin formed of a reflective material are disposed between the substrate and the phosphor layer, and a method for manufacturing the same.

An embodiment of the invention provides a light emitting device package that improves the extraction efficiency of side light by sealing the side surface of the light emitting device with a transparent resin.

An embodiment of the invention provides a light emitting device package in which a phosphor layer is disposed on a light emitting device, a first resin is disposed on a side surface of the phosphor layer and a second resin is disposed on a lower surface of the phosphor layer.

An embodiment of the invention provides a light emitting device package in which an optical lens having a convex lens portion is disposed on the light emitting device.

An embodiment of the invention provides a light emitting device package in which a light emitting device is disposed on a ceramic substrate, a phosphor layer and an optical lens are disposed on first and second resins, and a lighting device having the same.

An embodiment of the invention may provide a light emitting device package with improved light uniformity and light efficiency characteristics.

A light emitting device package according to an embodiment of the invention comprises a substrate including first and second frames; a light emitting device including a first bonding portion facing the first frame and a second bonding portion facing the second frame; a phosphor layer on the light emitting device; a first resin disposed around an upper surface of the substrate and the light emitting device; a second resin between the first resin and side surfaces of the light emitting device; and an adhesive layer between the phosphor layer and the light emitting device, wherein an outer portion of the phosphor layer protrudes more outward than a side surface of the light emitting device, and the adhesive layer includes a thickness thinner than a thickness of the phosphor layer. The first resin includes a reflective resin material and is disposed on the side surface of the phosphor layer, the second resin comprises a transparent resin material, and an outer surface of the second resin may include a curved surface facing the first resin.

According to the embodiment of the invention, the first resin extends between the lower surface of the light emitting device and the substrate, the second resin overlaps the lower surface of the outer side of the phosphor layer in a vertical direction, and the second resin may be connected to the adhesive layer.

According to the embodiment of the invention, the first and second frames include a plurality of recesses disposed along the outside of each corner of the light emitting device, the plurality of recesses may overlap the first and second resins in the vertical direction.

According to the embodiment of the invention, a thickness of the second resin may be greater than a thickness of the light emitting device, and may be smaller than the thickness of the first resin.

According to the embodiment of the invention, the outer surface of the second resin includes a convex curved surface in the first resin direction, and the convex curved surface of the first resin may overlap each side surface of the light emitting device in a horizontal direction.

According to the embodiment of the invention, a center of a circle having the convex curved surface in the second resin may be disposed on a region overlapped with the light emitting device in the vertical direction.

According to the embodiment of the invention, the outer surface of the second resin includes a concave curved surface, and a center of a circle having the concave curved surface in the second resin may be disposed on a region overlapped with the second resin in the vertical direction.

According to the embodiment of the invention, the substrate includes a body formed of a ceramic material, the substrate is a third frame surrounding the first and second frames around the outer periphery of the first and second frames, a plurality of frames on the lower surface of the substrate, and a plurality of connecting members penetrating the body and connected to the first and second frames, and an interval between the plurality of connecting members may be greater than a length of one side of the light emitting device.

According to the embodiment of the invention, an optical lens is disposed on the substrate, the phosphor layer, and the first resin, and the optical lens is adhered to the first and second frames and the upper surface of the body of the substrate, and an outer surface of the optical lens may be disposed on the same vertical plane as the side surface of the substrate.

According to the embodiment of the invention, a transparent third resin may be included between the first resin and the second resin, and the third resin may contact the side surface of the phosphor layer.

A light emitting device package according to an embodiment of the invention comprises a light emitting device including first and second electrodes, a light emitting structure on the first and second electrodes, and a transparent substrate on the light emitting structure; a phosphor layer disposed on the transparent substrate; and a first resin disposed around the light emitting device and the phosphor layer and comprising a reflective material, wherein the phosphor layer includes recesses recessed in an upper surface direction of the phosphor layer, and a part of the transparent substrate of the light emitting device is disposed on the recess, and the first resin includes an outer region in contact with a side surface of the phosphor layer, and a horizontal width of the outer region of the first resin may range from 30 μm to 500 μm.

According to the embodiment of the invention, the first resin includes a first region disposed on the side of the phosphor layer in a vertical direction and a second region disposed on the side of the light emitting device, and a thickness of the first region may be smaller than a thickness of the second region.

According to the embodiment of the invention, a step portion may be disposed between the first region and the second region.

According to the embodiment of the invention, the thickness of the first region may be in the range of 1:0.3 to 1:0.75 compared to the thickness of the second region.

According to the embodiment of the invention, the first resin may include a curvature of an inner surface facing the side surface of the light emitting device.

According to the embodiment of the invention, a transparent second resin is disposed between the first resin and the light emitting device, the outer surface of the second resin contacts the inner surface of the first resin and may have a curvature corresponding to a curvature of the first resin.

According to an embodiment of the invention, the first resin may be disposed on a part of the lower surface of the light emitting device, and the first resin may be disposed on the same plane as the lower surface of the first electrode and the second electrode.

According to the embodiment of the invention, the phosphor layer includes a center region overlapping the recess in the vertical direction and an outer region overlapping the second resin in the vertical direction, and a lower surface of the outer region is disposed to lower than an upper surface of the light emitting device, and a thickness of the recess may range from 0.1 to 0.5 compared to the thickness of the phosphor layer.

Advantageous Effects

An embodiment of the invention may improve the extraction efficiency of light emitted through the side surface of the light emitting device.

Embodiments of the invention may reduce the light loss on the side surface of the light emitting device.

According to an embodiment of the invention, by covering the second resin of the light-transmitting material adhered to the light emitting device with the first resin, an extraction of side light of the light emitting device and light reflection in the upper direction may be guided.

According to an embodiment of the invention, the light flux of the light emitting device package may be improved.

The light emitting device package according to an embodiment of the invention may improve light extraction efficiency by disposing first and second resins around the light emitting device.

An embodiment of the invention may provide a light emitting device package having a lens, thereby improving an angle of beam spread.

In an embodiment of the invention, light uniformity and light efficiency characteristics may be improved in a light emitting device package.

According to an embodiment of the invention, light efficiency characteristics and moisture resistance of the light emitting device package may be improved.

The reliability of the light emitting device package according to an embodiment of the invention may be improved.

DETAILED DESCRIPTION OF THE EMBODIMENTS OF THE INVENTION

Hereinafter, preferred embodiments of the invention will be described in detail with reference to the accompanying drawings.

However, the technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, can be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) can be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

First Example

Figure 1:
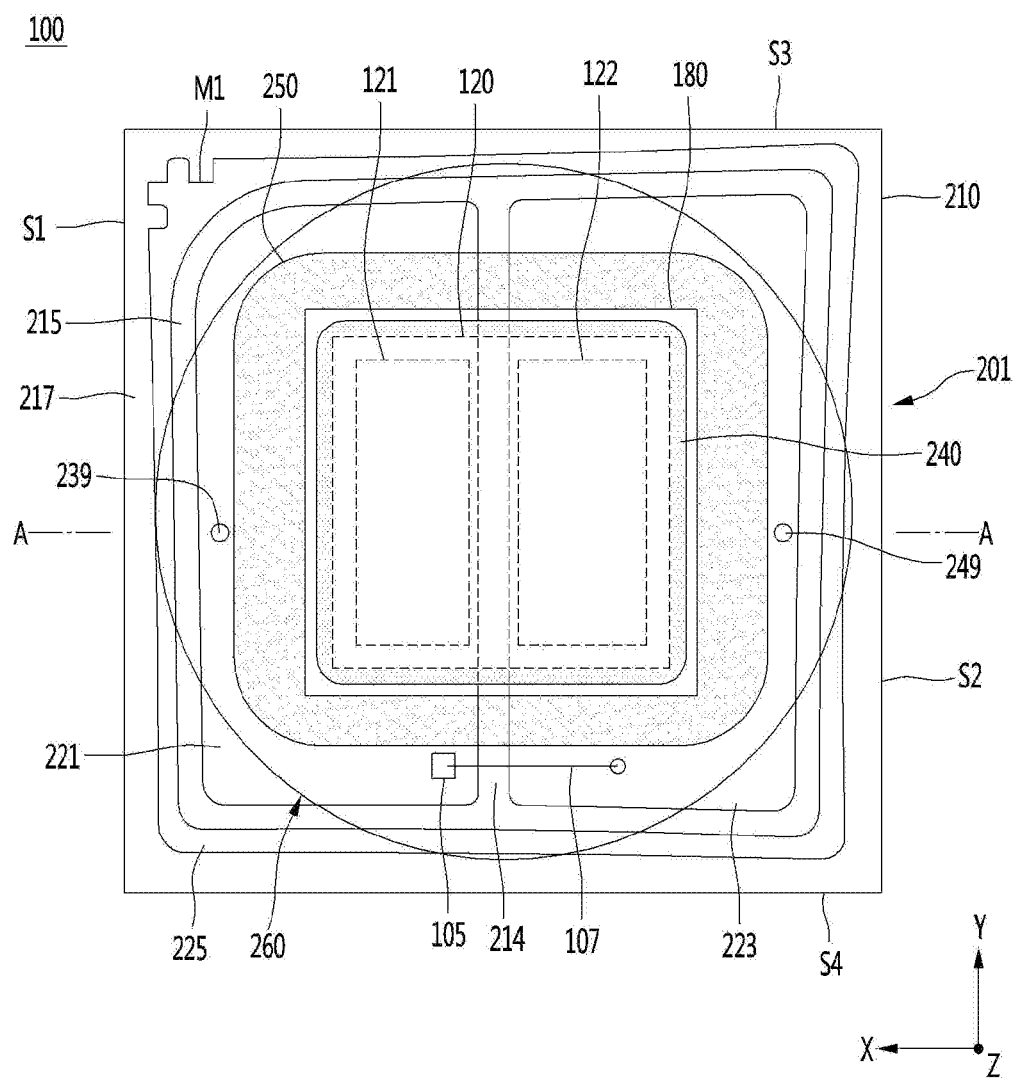
FIG. 1 is a plan view of a light emitting device package according to a first embodiment of the invention.
Figure 2:
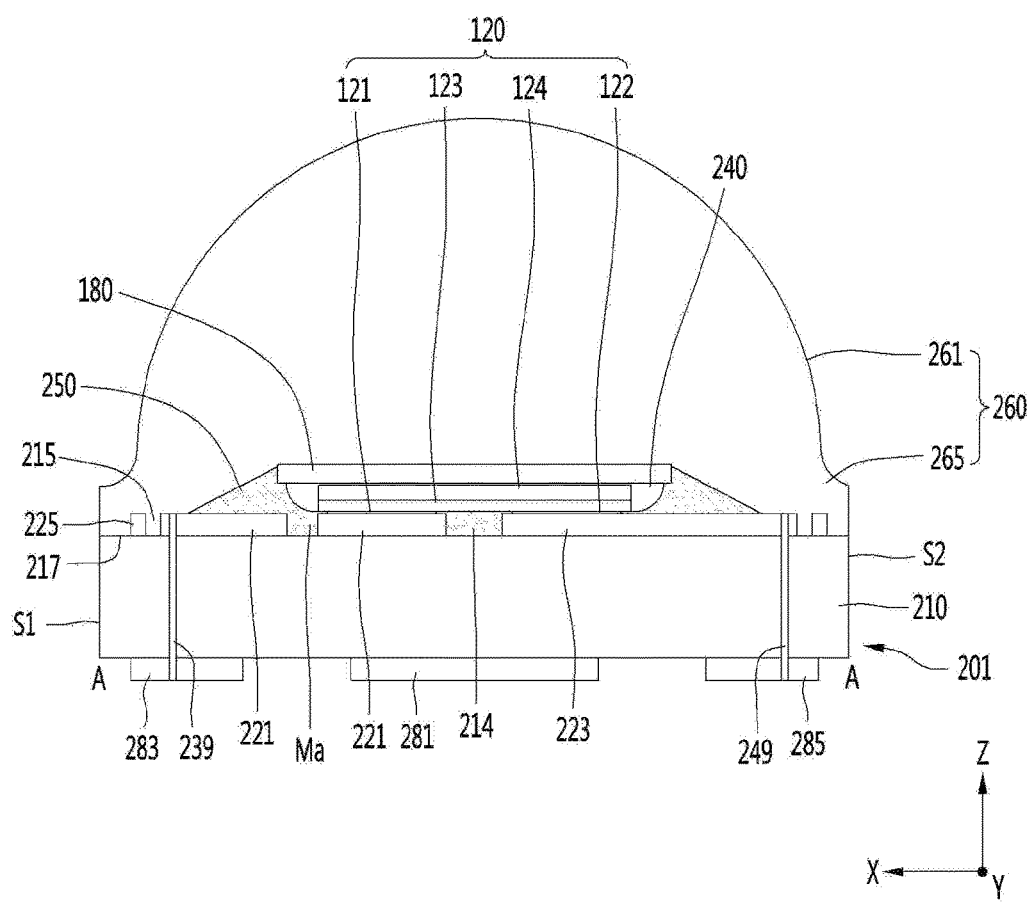
FIG. 2 is a cross-sectional view taken along the line A-A of the light emitting device package of FIG. 1.
Figure 3:
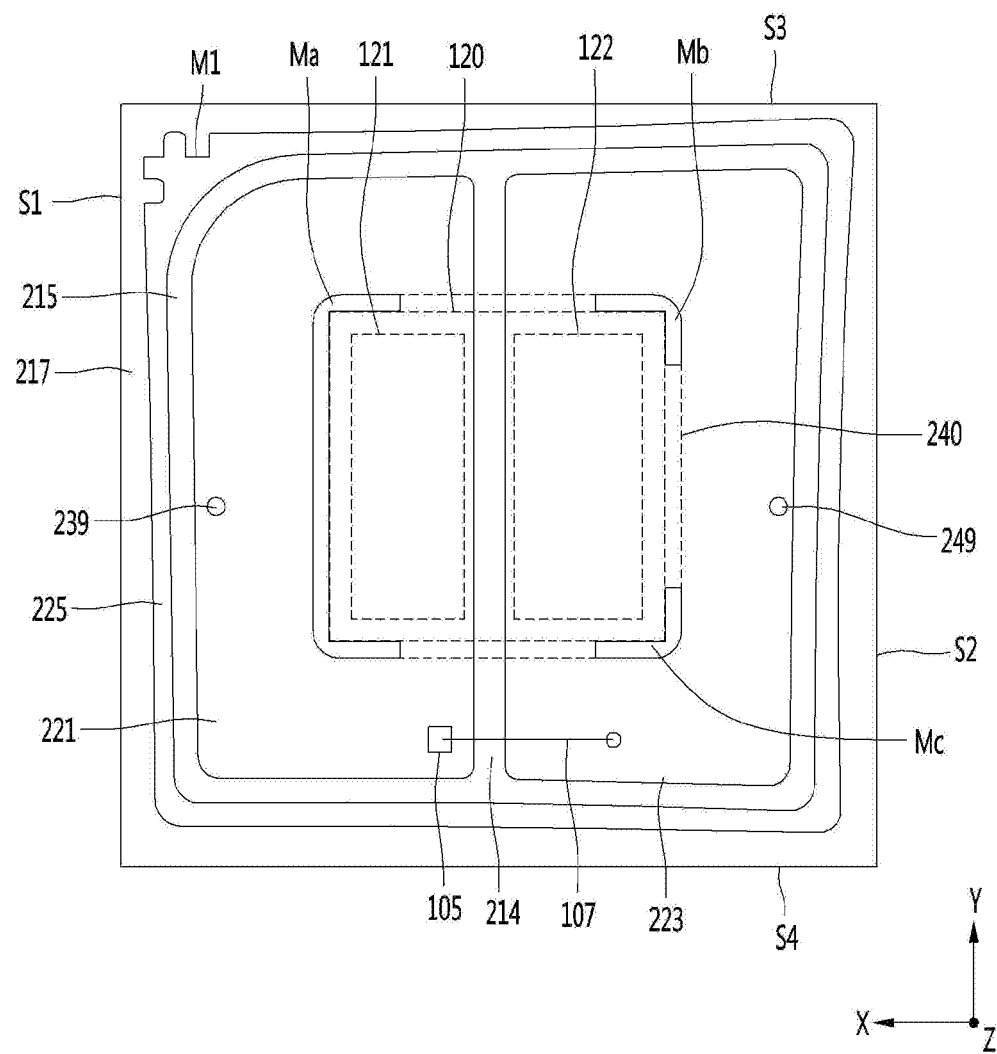
FIG. 3 is an example in which a light emitting device is disposed on a substrate of the light emitting device package of FIG. 1.
Figure 4:
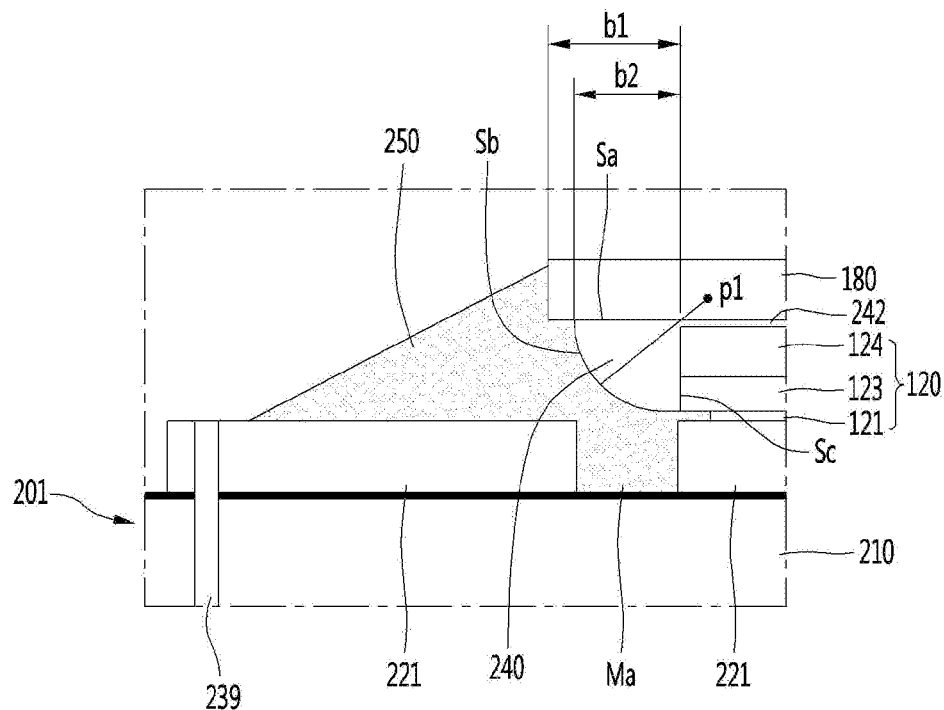
FIG. 4 is a partially enlarged view showing first and second resins in the light emitting device package of FIG. 2.

FIG. 1 is a plan view of a light emitting device package according to a first embodiment of the invention, FIG. 2 is an A-A side sectional view of the light emitting device package of FIG. 1, and FIG. 3 is an example in which a light emitting device is disposed on a substrate of the light emitting device package of FIG. 1, and FIG. 4 is a partially enlarged view showing first and second resins in the light emitting device package of FIG. 2.

Referring to FIGS. 1 to 4, the light emitting device package 100 may include a substrate 201, a light emitting device 120 disposed on the substrate 201, and an optical lens 260 on the light emitting device 120. The light emitting device package 100 may include a phosphor layer 180 disposed on the light emitting device 120. The light emitting device package 100 may include a first resin 250 disposed around the light emitting device 120, and a second resin 240 disposed between the first resin 250 and the light emitting device 120.

The substrate 201 includes a body 210 and a plurality of frames 221 and 223 disposed on an upper surface of the body 210. The plurality of frames 221 and 223 may be electrically connected to the light emitting device 120. The substrate 201 may include a third frame 225 on the outer side of the upper surface of the body 210.

The body 210 includes an insulating material or a thermally conductive material. The body 210 includes, for example, a ceramic material. The ceramic material includes a low temperature co-fired ceramic (LTCC) or a high temperature co-fired ceramic (HTCC) that is simultaneously fired. The material of the body 210 may be a metal compound, for example, $Al_2O_3$, or AlN, and may preferably include aluminum nitride (AlN) or alumina ($Al_2O_3$), or a metal oxide having a thermal conductivity of 140 W/mK or more.

As another example, the body 210 may be formed of a resin-based insulating material, for example, a resin material such as Polyphthalamide (PPA). The body 210 may be formed of a heat-curable resin comprising a silicone, epoxy resin, or plastic material, or a high heat resistance and high light resistance material. As another example, an acid anhydride, an antioxidant, a release material, a light reflector, an inorganic filler, a curing catalyst, a light stabilizer, a lubricant, and titanium dioxide may be selectively added to the body 210. The body 210 may be made of at least one selected from a group of epoxy resin, modified epoxy resin, silicon resin, modified silicon resin, acrylic resin, and urethane resin. For example, a b-staged solid epoxy resin composite may be used by adding DBU(1,8-Diazabicyclo (5,4,0)undecene-7) as a curing catalyst and ethylene glycol, titanium oxide paint, and glass fiber as cocatalysts to epoxy resin and partially curing to epoxy resin composed of triglycidylisocyanurate, hydrogenated bisphenol A diglycidyl ether, etc., acid anhydride composed of hexa hydro phthalic anhydride, 3-methy hexa hydro phthalic anhydride, 4-methyl hexa hydro phthalic anhydride etc., by hearing, which does not limit the present invention.

The thickness of the body 210 may be formed in a range of 1 mm or less, for example, 0.45 mm to 0.55 mm, and when the thickness is thinner than the above range, there is a problem in that the heat dissipation efficiency is lowered and may not be supported. When the thickness of the body 210 is greater than the above range, there is problem in that an improving of the heat dissipation efficiency is insignificant and the thickness of the substrate 201 increases.

A width of a first direction X of the substrate 201 may be the same as or different from a length of a second direction Y. The width or length of the substrate 201 may be 1.5 mm or more, for example, in the range of 2 mm to 4 mm, and when the width or length is smaller than the range, the heat dissipation efficiency for the large-area light emitting device 120 may be reduced. The efficiency of light may also be lowered, and when it is larger than the above range, waste of material may be caused. Here, the size of the light emitting device 120 may have a length of one side surface of 1 mm or more. The width or length of the substrate 201 may vary depending on the size of the light emitting device 120.

The light emitting device 120 may have a polygonal shape, for example, a square shape or a rectangular shape. The length of one side of the light emitting device 120 may be 40% or more, for example, 40% to 80% of the length of one side of the substrate 201. The light emitting device 120 may be arranged in a larger area than an area of the upper surface of the substrate 201, thereby improving light extraction efficiency by the large area light emitting device 120.

Referring to FIGS. 1 and 2, the first frame 221 of the substrate 201 may be electrically separated from the second frame 223. The first frame 221 and the second frame 223 are electrically separated from the third frame 225. The first gap region 214 is a region in which the first frame 221 and the second frame 223 are removed, and the first frame 221 and the second frame 223 may be separated. The third frame 225 may be disposed around the outside of the first frame 221 and the second frame 223. The third frame 225 may be a continuously connected ring shape or a discontinuous ring shape. The second gap region 215 may physically separate the first frame 221 and the second frame 223 from the third frame 225. The first gap region 214 and the second gap region 215 may be connected to each other.

The first frame 221 may function as a terminal of the first polarity, and the second frame 223 may function as a terminal of the second polarity. The first and second polarities may be electrically different polarities. For example, when the first polarity is a cathode, the second polarity may be an anode, and conversely, when the first polarity is an anode, the first polarity may be a cathode. Here, as another example, the third frame 225 may be connected to any one of the first frame 221 and the second frame 223. The third frame 225 may include a mark portion M1 for displaying or distinguishing the polarity of the first frame 221. The third frame 225 may be spaced apart from the side surfaces S1, S2, S3, and S4 of the body 210. A perimeter of the upper surface of the upper surface of the body 210 may include an open region 217 where the upper surface of the body is exposed. The upper surface of the body 210 may be exposed in the open region 217 and the first and second gap areas 214 and 215. The lower portion of the optical lens 260 may be adhered to the upper surface of the body 210 through the open region 217, thereby suppressing moisture penetration from the outside.

The first frame 221 and the second frame 223 may be disposed on both sides of the center on the body 210 of the substrate 201. Each of the first frame 221 and the second frame 223 may be disposed at a larger size than the size of the light emitting device 120 on the upper surface of the body 210. The light emitting device 120 may be disposed on at least one of the first frame 221 and the second frame 223. For example, the light emitting device 120 may be disposed on the first frame 221 and the second frame 223. The light emitting device 120 may overlap the first frame 221 and the second frame 223 in the vertical direction.

The upper surface area of the first frame 221 and the upper surface area of the second frame 223 may be the same or may have an area difference of 20% or less. The first frame 221 and the second frame 223 are electrically connected to the light emitting device 120, and heat generated from the light emitting device 120 may be conducted or radiated through the body 210. In addition, by minimizing the area difference between the first and second frames 221 and 223, it is possible to prevent a thermal collision problem due to a difference in heat dissipation.

Referring to FIG. 2, the substrate 201 may include connection members 239 and 249 and lower frames 281, 283 and 285. The connecting members 239 and 249 and the lower frames 281, 283 and 285 may be disposed on the lower surface of the body 210. The lower frame may include a first lower frame 281, second and third lower frames 283 and 285. The first lower frame 281 may function as a heat dissipation plate on the lower surface of the body 210, and may overlap the light emitting device 120 in the vertical direction. The first lower frame 281 may be separated from the second and third lower frames 283 and 285.

The second and third lower frames 283 and 285 may function as terminals for supplying power. The second lower frame 283 is connected to the first frame 221 through a first connecting member 239, and the third lower frame 285 may connected to a second frame 223 through a second connecting member 249. The first connecting member 239 may penetrate the upper and lower surfaces of the body 210 and connect the first frame 221 and the second lower frame 283. The second connecting member 249 may penetrate the upper and lower surfaces of the body 210 and connect the second frame 223 and the third lower frame 285. The first lower frame 281 overlaps the first frame 221 and the second frame 223 in the vertical direction, and the second lower frame 283 may be overlapped with a portion of the first frame 221 in the vertical direction, the third lower frame 285 may be overlapped with a portion of the second frame 223 in the vertical direction.

The first, second and third frames 221, 223, 225 and the first, second, and third lower frames 281, 283, 285 may include a plurality of metals of titanium Ti, copper Cu, nickel Ni, gold Au, chrome Cr, tantalum Ta, white gold Pt, tin Sn, silver At, and phosphorus P, and may be formed in multiple layers. A silver Ag or aluminum Al layer is formed on surfaces of the first frame 221 and the second frame 223 to improve the efficiency of incident light reflection. A gold Au layer is formed on the surfaces of the first and second and third lower frames 281, 283, and 285 to prevent corrosion due to moisture, and to improve electrical reliability.

Each of the first to third frames 221, 223, and 225 and the first to third lower frames 281, 283, and 285 may be formed to a thickness in the range of 85±20 µm, when it is out of the above range, electrical characteristics and heat conduction characteristics may be reduced.

Each of the first and second connecting members 239 and 249 may be disposed in one or more in the body 210. The first and second connecting members 239 and 249 may be formed of a conductive material, such as a metal material.

As illustrated in FIG. 1, an interval between the first and second connecting members 239 and 249 is disposed to be greater than the length or width of the light emitting device 120, thereby reducing interference between each other and improving electric transmission and heat dissipation efficiency.

The light emitting device 120 may include a first bonding portion 121, a second bonding portion 122, and a light emitting structure 123. The light emitting device 120 may include a transparent substrate 124 on the light emitting structure 123. The light emitting device 120 may emit light through a plurality of side surfaces and upper surface.

The light emitting structure 123 may include a first conductivity type semiconductor layer, a second conductivity type semiconductor layer, and an active layer disposed between the first conductivity type semiconductor layer and the second conductivity type semiconductor layer. The light emitting structure 123 may emit at least one or more of UV, blue, green, red, and white lights. The light emitting structure 123 may emit, for example, blue light.

According to an embodiment of the invention, the light emitting structure 123 may be provided as a compound semiconductor. The light emitting structure 123 may be provided as, for example, a compound semiconductors of group II-VI elements or a group III-V elements. For example, the light emitting structure 123 may include at least two or more elements selected from aluminum (Al), gallium (Ga), indium (In), phosphorus (P), arsenic (As), and nitrogen (N).

The light emitting structure 123 may include the first conductivity type semiconductor layer, an active layer, and the second conductivity type semiconductor layer. The first and second conductivity type semiconductor layers may be implemented as at least one of a compound semiconductors of group III-V elements or a group II-VI elements. The first and second conductivity type semiconductor layers may be formed, for example, semiconductor materials having a composition formula of $In_xAl_yGa_{1-x-y}N$ ($0 \leq x \leq 1$, $0 \leq y \leq 1$, $0 \leq x+y \leq 1$). For example, the first and second conductivity type semiconductor layers may include at least one selected from the group including GaN, AlN, AlGaN, InGaN, InN, InAlGaN, AlInN, AlGaAs, GaP, GaAs, GaAsP, AlGaInP, etc. The first conductivity type semiconductor layer may be an n-type semiconductor layer doped with n-type dopants such as Si, Ge, Sn, Se, and Te. The second conductivity type semiconductor layer may be a p-type semiconductor layer doped with p-type dopants such as Mg, Zn, Ca, Sr, and Ba.

The active layer may be implemented with a compound semiconductor. The active layer may be embodied as at least one of compound semiconductors of group III-V elements or II-VI elements. When the active layer is implemented with a multi-well structure, the active layer may include a plurality of alternating well layers and a plurality of barrier layers, and may be formed of semiconductor materials having a composition formula of $In_xAl_yGa_{1-x-y}N$ ($0 \leq x \leq 1$, $0 \leq y \leq 1$, $0 \leq x+y \leq 1$). For example, the active layer may include at least one selected from the group comprising InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs.

The first conductivity type semiconductor layer may be disposed between the transparent substrate 124 and the active layer. The second conductivity type semiconductor layer may be disposed between the active layer and the bonding portions 121 and 122.

The first bonding portion 121 may be electrically connected to the first conductivity type semiconductor layer. The second bonding portion 122 may be electrically connected to the second conductivity type semiconductor layer.

The transparent substrate 124 is a light-transmitting layer, and may be formed of an insulating material or a semiconductor material. The transparent substrate 124 may be selected from a group including, for example, a sapphire substrate ($Al_2O_3$), SiC, GaAs, GaN, ZnO, Si, GaP, InP, Ge. For example, an uneven pattern may be formed on the surface of the transparent substrate 124.

The light emitting device 120 may be disposed on the first frame 221 and the second frame 223. The light emitting device 120 may disposed on the body 210.

The first bonding portion 121 and the second bonding portion 122 may be arranged to be spaced apart from each other based on the direction in which the body 210 is disposed on the lower surface of the light emitting device 120. The first bonding portion 121 may be disposed on the first frame 221. The second bonding portion 122 may be disposed on the second frame 223. The first bonding portion 121 may face the first frame 221. The second bonding portion 122 may face the second frame 223.

In the light emitting device package 100 according to an embodiment of the invention, power is connected to the first bonding portion 121 of the light emitting device 120 through the first frame 221, and the second frame 223 is connected to the light emitting device package 100. Power may be connected to the second bonding portion 122 of the light emitting device 120. The first bonding portion 121 and the second bonding portion 122 may be electrodes or pads. Accordingly, the light emitting device 120 may be driven by driving power supplied through the first bonding portion 121 and the second bonding portion 122. In addition, light emitted from the light emitting device 120 may be provided in an upper direction of the body 210.

The first bonding portion 121 may be disposed between the light emitting structure 123 and the first frame 211. The second bonding portion 122 may be disposed between the light emitting structure 123 and the second frame 213. The first bonding portion 121 and the second bonding portion 122 may be formed of a metal material. The first bonding portion 121 and the second bonding portion 122 may formed of single layer or multiple layers using one or more materials or alloy selected from the groups including Cu, Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, and Ni/IrOx/Au/ITO.

The light emitting device 120 may include one or a plurality of light emitting cells therein. The light emitting cell may include at least one of n-p junction, p-n junction, n-p-n junction, and p-n-p junction. The plurality of light emitting cells may be connected to each other in series within one light emitting device. Accordingly, the light emitting device may have one or a plurality of light emitting cells, and when n light emitting cells are disposed in one light emitting device, the light emitting device may be driven with a driving voltage of n times. For example, when a driving voltage of one light emitting cell is 3V, and two light emitting cells are disposed on one light emitting device, each light emitting device may be driven with a driving voltage of 6V. Alternatively, when a driving voltage of one light emitting cell is 3V, and three light emitting cells are disposed on one light emitting device, each light emitting device may be driven with a driving voltage of 9V. The number of light emitting cells disposed on the light emitting device may be 1 or 2 to 5.

The first bonding portion 121 may be connected to the first frame 221 and a conductive portion, or may be bonded to each other. The second bonding portion 122 may be connected to the second frame 223 and a conductive portion, or may be bonded to each other. The conductive portion may be bonded to the first bonding portion 121 and the second bonding portion 122 on the upper surfaces of the first frame 221 and the second frame 223. The conductive portion may include one material selected from the group including Ag, Au, Pt, Sn, Cu, or an alloy thereof. At least one of the first frame 221 and the second frame 223 and the bonding portions 121 and 122 may be combined by a material intermetallic layer by combining a material constituting the material and the conductive part. The intermetallic compound may include at least one of $Cu_xSn_y$, $Ag_xSn_y$, and $Au_xSn_y$, and x may satisfy the conditions of $0<x<1$, $y=1-x$, $x>y$. The conductive portion may be formed using a conductive paste. The conductive paste may include a solder paste, a silver paste, or the like, and may be composed of a multilayer or a single layer composed of a multi-layer or alloy composed of different materials. For example, the conductive portion may include a SAC (Sn—Ag—Cu) material.

The light emitting device 120 is a light source, and selectively emits light in a wavelength range from ultraviolet light to visible light. The light emitting device 120 includes a UV LED chip, a green LED chip, a block LED chip, and a red LED chip. The light emitting device 120 may have a thickness of 30 µm or more, for example, may range from 50 µm to 180 µm. The light emitting device 120 may be arranged in the form of a flip chip. The light emitting device 120 may be disposed as a horizontal chip or a vertical chip.

A protection device 105 may be disposed above or below any one of the first and second frames 221 and 223, and the protection device 105 is disposed on the first frame 221 and a second frame 223 and a wire 107. The protection device 105 may be implemented with a thyristor, a Zener diode, or a transient voltage suppression (TVS), and the protection device 105 protects the light emitting device 120 from electrostatic discharge (ESD).

Referring to FIG. 3, the first frame 221 and the second frame 223 may include recesses Ma, Mb, and Mc corresponding to edge regions of the light emitting device 120. The recesses Ma, Mb, and Mc may be regions in which the first frame 221 and the second frame 223 are etched and removed. As shown in FIG. 2, the recesses Ma, Mb, and Mc may pass through the first frame 221 and the second frame 223 and expose the upper surface of the body 210. The first recess Ma of the first frame 221 is formed along the first side and both edges of the light emitting device 120, and the second and third recesses Mb and Mc of the second frame 223 may be formed under both corner portions of the second side opposite to the first side of the light emitting device 120. The size of the region connecting the first, second, and third recesses Ma, Mb, and Mc may be larger than the size of the lower surface of the light emitting device 120. The first, second, and third recesses Ma, Mb, and Mc may be spaced apart from each other, and may be disposed along the lower edge of the light emitting device 120. The first, second, and third recesses Ma, Mb, and Mc may function as grooves or marks for guiding the mounting of the light emitting device 120, and may function to receive the conductive portion to prevent the conductive portion from being exposed outside the light emitting device 120. The first, second and third recesses Ma, Mb and Mc may be combined with at least one of the first resin 250 and the second resin 240. For example, the first resin 250 may be disposed in the first, second, and third recesses Ma, Mb, and Mc, thereby supporting the first resin 250 or preventing to move or tilt of the light emitting device 120.

Referring to FIGS. 1 and 2, the phosphor layer 180 may be disposed on the upper surface of the light emitting device 120. The phosphor layer 180 may be disposed on the transparent substrate 124 of the light emitting device 120. The phosphor layer 180 may be the same as the upper surface area of the light emitting device 120 or larger than the upper surface area of the light emitting device 120. The outer portion of the phosphor layer 180 may protrude outward than the side surface of the light emitting device 120.

Referring to FIG. 4, the outer portion of the phosphor layer 180 may protrude at a predetermined distance b1 from the side surface of the light emitting device 120. The distance b1 may include 80 micrometers or more, for example, in a range of 80 to 120 micrometers. When the distance b1 is smaller than the above range, light emitted from the light emitting device 120 may be emitted through the outside of the phosphor layer 180 and wavelength conversion efficiency may be reduced. When the distance b1 is larger than the above range, improvement in wavelength conversion efficiency may be insignificant. The phosphor layer 180 may protrude more outward than the front side surface of the light emitting device 120 at the distance b1, so that the wavelength of some light emitted in the upper direction through the light emitting device 120 may be converted by the phosphor layer 180. The length of one side of the phosphor layer 180 may be greater than 160 micrometers or more, for example, in a range of 160 to 240 micrometers, based on the length of one side surface of the light emitting device 120.

The phosphor layer 180 absorbs some light emitted from the light emitting device 120 and converts the wavelength to light of a different wavelength. In the phosphor layer 180, a phosphor is added to a light-transmitting resin material such as UV (Ultra violet) resin, silicone or epoxy, and the phosphor may include at least one of a yellow phosphor, a green phosphor, a blue phosphor, and a red phosphor. For example the phosphor may be at least any one or more selected from a nitride-based phosphors that is usually activated by lanthanide-based elements such as Eu and Ce, an oxynitride-based phosphor, a sialon-based phosphor, an alkali-earth halogen apatite phosphor, alkali-earth metal boric acid halogen phosphor, an alkali-earth metal aluminate phosphor, alkali-earth silicate, alkali-earth sulfide, alkali-earth thiogallate, alkali-earth silicon nitride, and germinate that are usually activated by lanthanide-based elements such as Eu and transition metal-based elements such as Mu, or earth aluminate and earth silicate that are usually activated by lanthanide-based elements such as Ce, or organisms and organic complexes that are usually activated by lanthanide-based elements such as Eu. As a detailed example, these phosphors may be used, but the present invention is not limited thereto.

The light emitted from the phosphor layer 180 and the light emitted from the light emitting device 120 may be mixed as white light. The white light may have a color temperature of at least one of warm white, cool white, or neutral white.

The phosphor layer 180 may have a thickness different from that of the light emitting device 120. The phosphor layer 180 may be provided in a film form. The phosphor layer 180 may be provided in a horizontal plane with an upper surface and a lower surface.

The light emitting device package 100 according to the first embodiment of the invention may include a first resin 250 and a second resin 240. The first resin 250 may be disposed around the light emitting device 120. The first resin 250 may be disposed on upper surfaces of the first frame 221 and the second frame 223. The first resin 250 may be disposed along the outer periphery of the light emitting device 120 and contact the upper surfaces of the first frame 221 and the second frame 223. A portion of the first resin 250 may be disposed in the first gap region 214. As shown in FIG. 4, a part of the first resin 250 may be disposed in the first recess Ma.

The first resin 250 may include a reflective material. The first resin 250 may be a reflective member or a reflective resin member. The first resin 250 may include a metal oxide in a resin material. The resin material includes silicon or epoxy, and the metal oxide is a material having a higher refractive index than the resin material, for example, at least one of $Al_2O_3$, $TIO_2$ or $SiO_2$. The metal oxide is formed in the first resin 250 in a range of 5 wt % or more, for example, 5 to 30 wt %. The first resin 250 may have a reflectance of 90% or more with respect to light emitted from the light emitting device 120. The first resin 250 may be formed of a white resin material.

The first resin 250 may be disposed around the phosphor layer 180. The first resin 250 may contact the side surface of the phosphor layer 180. The first resin 250 may contact the lower surface of the phosphor layer 180. The first resin 250 may have a gradually thinner width as it is adjacent to the upper surface or upper edge of the phosphor layer 180.

The upper end of the first resin 250 may have the same height as the upper surface of the phosphor layer 180 or a lower height than the upper surface of the phosphor layer 180. The first resin 250 reflects light emitted through the side surface of the light emitting device 120. The first resin 250 reflects light emitted to the side surface of the phosphor layer 180.

When the first resin 250 is dispensed around the light emitting device 120, it may extend to the side surface of the phosphor layer 180 by capillary action. Accordingly, an air gap may not be formed in a region between the first resin 250 and the second resin 240 and the phosphor layer 180, so that the first resin 250 and the second resin 240 And the phosphor layer 180 to enhance adhesion to the region.

Referring to FIGS. 1, 3 and 4, the first resin 250 is disposed on an outer periphery further than the upper edge of the phosphor layer 180, supports the side surface of the light emitting device 120, and may be reflected an incident light to the surface. The surface of the first resin 250 may be an inclined surface or may include a concave curved surface. The first resin 250 may be in contact with the upper surfaces of the first frame 221 and the second frame 223, an inner portion of the first gap region 214, and the upper surface of the body 210 exposed to the first, second, and third recesses Ma, Mb, and Mc.

The second resin 240 may be disposed between the side surface of the light emitting device 120 and the first resin 250. The second resin 240 may contact the side surface of the light emitting device 120, the inner surface of the second resin 240 and the lower surface of the phosphor layer 180.

As shown in FIG. 4, the second resin 240 may be disposed around the light emitting device 120. The second resin 240 may be disposed on each side surface of the light emitting device 120. The second resin 240 may contact all side surfaces of the light emitting device 120. The thickness of the second resin 240 may be the same as or thicker than the thickness of the light emitting device 120. The second resin 240 may contact an interface between the phosphor layer 180 and the light emitting device 120. The thickness of the second resin 240 may be thinner than the thickness of the first resin 250. The thickness of the second resin 240 may be 100 micrometers or more, for example, 100 to 200 micrometers. The thickness of the second resin 240 may vary depending on the thickness of the light emitting device 120. Here, the maximum thickness of the second resin 240 may be greater than the thickness of the light emitting device 120 and smaller than the maximum thickness of the first resin 250.

The second resin 240 may be formed of a transparent material. The second resin 240 may be a transparent member or a transparent resin member. The refractive index of the second resin 240 may be 1.8 or less, for example, in the range of 1.1 to 1.8 or in the range of 1.4 to 1.6. The second resin 240 may be formed of a transparent resin material. The second resin 240 may include, for example, UV (Ultra violet) resin, or a silicone-based or epoxy-based material. The second resin 240 may include a methyl-phenyl system.

The second resin 240 may include a resin material having a higher transmittance and adhesion than that of the first resin.

The upper surface Sa of the second resin 240 may contact the lower surface of the phosphor layer 180. The outer surface Sb of the second resin 240 may be in contact with the inner surface of the first resin 250. At this time, since the first resin 250 is a reflective material and is provided with a concave curved surface or a reflective structure surrounding the outside of the second resin 240, an inner region of the first resin 250 may be provided as a cavity region.

The inner surface Sc of the second resin 240 may be in contact with the side surface of the light emitting device 120. The second resin 240 may overlap the outer portion of the phosphor layer 180 in the vertical direction. The width b2 of the upper surface Sa of the second resin 240 may be equal to or smaller than the distance b1 of the outer portion of the phosphor layer 180. The width b2 may be 100 micrometers or less, for example, in the range of 50 to 100 micrometers. When the width b2 of the upper surface Sa of the second resin 240 is smaller than the above range, light extraction efficiency may deteriorate, and when it is larger than the above range, light loss may occur. The second resin 240 may have a gradually thinner width toward the lower portion thereof.

The outer surface Sb of the second resin 240 may include a curved surface convex in an outward or diagonal direction between the lower surface of the phosphor layer 180 and the side surface of the light emitting device 120. The entire outer surface Sb of the second resin 240 may be provided as a convex curved surface. The outer surface Sb of the second resin 240 may be formed into a shape having a curved surface by surface tension after the resin liquid that is pressed through the interface between the phosphor layer 180 and the light emitting device 120 is diffused.

The outer surface Sb of the second resin 240 may have a predetermined curvature, and a center p1 of a circle having a radius of curvature of the outer surface Sb may be plated on an overlapped region with the light emitting device 120 in the vertical direction. The inner surface of the first resin 250 is in contact with the outer surface Sb of the second resin 240 and may include a concave curved surface. When the inner surface of the first resin 250 is formed as a concave curved surface, the inner surface of the first resin 250 may reflect light incident through the first resin 250 in the direction of the phosphor layer 180.

The second resin 240 may overlap the transparent substrate 124 and the light emitting structure 123 of the light emitting device 120 in the horizontal direction. Accordingly, light emitted through the side surfaces of the transparent substrate 124 and the light emitting structure 123 is guided through the second resin 240 and reflected by the first resin 250, or inputted to the lower surface of the phosphor layer 180.

The second resin 240 may be disposed between the phosphor layer 180 and the substrate 210 in the vertical direction, or may be disposed between the phosphor layer 180 and the first frame 221 and the second frame 223. A portion of the second resin 240 may be disposed between the phosphor layer 180 and the first, second, and third recesses Ma, Mb, and Mc of the substrate 210 in the vertical direction.

The inner portion of the first resin 250 may be disposed on the first, second, and third recesses Ma, Mb, and Mc, or may extend to the lower surface of the light emitting device 120. The inner portion of the first resin 250 may penetrate into the region between the light emitting device 120 and the substrate 201 by capillary action. Accordingly, the second resin 240 may be disposed between the phosphor layer 180 and the first resin 250 in the vertical direction. The interval between the lower surface of the light emitting device 120 and the upper surface of the substrate 201 may be 100 micrometers or less, for example, in a range of 30 to 100 micrometers.

The second resin 240 may be spaced apart from the upper surface of the body 210 and the upper surfaces of the first frame 221 and the second frame 223. The second resin 240 may be in non-contact with the upper surface of the substrate 201. The second resin 240 may be in non-contact with the first bonding portion 121 and the second bonding portion 122 of the light emitting device 120. As another example, when the amount of the dispensed resin is larger, the second resin 240 may contact the upper surface of the substrate 201 or the first bonding portion 121 and the second bonding portion 122.

The outer surface Sb of the second resin 240 may have the same radius of curvature or different radiuses of the curvature from each other on each side surface of the light emitting device 120. This may increase or decrease the radius of curvature of the outer surface Sb of the second resin 240 at each side surface of the light emitting device 120, when the amount of the dispensed resin is taken out or insufficient. The arc length of the outer surface Sb of the second resin 240 may be the same or different from each other on each side surface of the light emitting device 120.

Referring to FIGS. 2 and 4, the light emitting device package 100 may include an adhesive layer 242. The adhesive layer 242 may be disposed between the phosphor layer 180 and the light emitting device 120. The adhesive layer 242 may be adhered to the lower surface of the phosphor layer 180 and the upper surface of the light emitting device 120. The adhesive layer 242 may be adhered to the upper surface of the transparent substrate 124 of the light emitting device 120. The thickness of the adhesive layer 242 may be thinner than the thickness of the phosphor layer 180. The thickness of the adhesive layer 242 may be 50 micrometers or less, for example, in the range of 0.01 to 50 micrometers. When the thickness of the adhesive layer 242 is greater than the above range, a problem that the outer surface shape of the second resin 240 does not have a curved surface may occur, and when the thickness of the adhesive layer 242 is greater than the above range, adhesive strength may be reduced. The adhesive layer 242 may be connected to the second resin 240. The adhesive layer 242 may be formed of the same material as that of the second resin 240. The adhesive layer 242 may be connected to the second resin 240 disposed on each side surface of the light emitting device 120.

In the exemplary embodiment of the invention, since the second resin 240 of the light-transmitting material is disposed between the light emitting device 120 and the first resin 250 of the reflective material, the light passing through the second resin 240 may be reflected toward the phosphor layer 180. Accordingly, loss of light emitted through the side surface of the light emitting device 120 may be reduced, thereby improving the light flux of the package. In addition, when the light reflected by the phosphor layer 180 is re-reflected when incident on the second resin 240, light loss may be suppressed and light flux may be improved.

The light emitting device package 100 according to an embodiment of the invention may include an optical lens 260. The optical lens 260 is disposed on the substrate 201 and may seal the light emitting device 120. The optical lens 260 may be disposed on the upper surface and the side surfaces of the light emitting device 120. The optical lens 260 may extend to the upper surface of the first to third frames 221, 223, 225 and the upper surface of the body 210 disposed around the light emitting device 120.

The optical lens 260 may be formed of a transparent resin material such as silicone or epoxy. As another example, the optical lens 260 may be formed of a glass material or a transparent plastic material. The optical lens 260 may be injection molded on the substrate 201.

The optical lens 260 includes a lens portion 261 and a buffer portion 265, and the lens portion 261 protrudes in a hemispherical shape on the light emitting device 120. The central portion of the lens portion 261 protrudes upward. The height of the lens portion 261 may be 2 mm or less, for example, in the range of 1.2 mm to 2 mm, and when the height of the lens portion 261 is outside the above range, the thickness of the light emitting device package 100 may be increased, and when it is smaller than the range, light extraction efficiency may be lowered.

The buffer portion 265 of the optical lens 260 is disposed around the light emitting device 120 and may have a concave curved surface or a flat upper surface. The buffer portion 265 of the optical lens 260 may extend outside the first, second, and third frames 221, 223, and 225 around the light emitting device 120. The buffer portion 265 may contact the upper surface of the body 210 in a region where the first, second, and third frames 221, 223, and 225 of the body 210 are not formed. The outer side surface of the buffer portion 265 may be disposed on the same vertical surface as the side surfaces S1, S2, S3, and S4 of the body 210, but is not limited thereto. The buffer portion 265 may be formed along the outer edge of the body 210, to prevent moisture penetration. The thickness of the buffer portion 265 may be provided to a thickness that may prevent moisture penetration.

Figure 5:
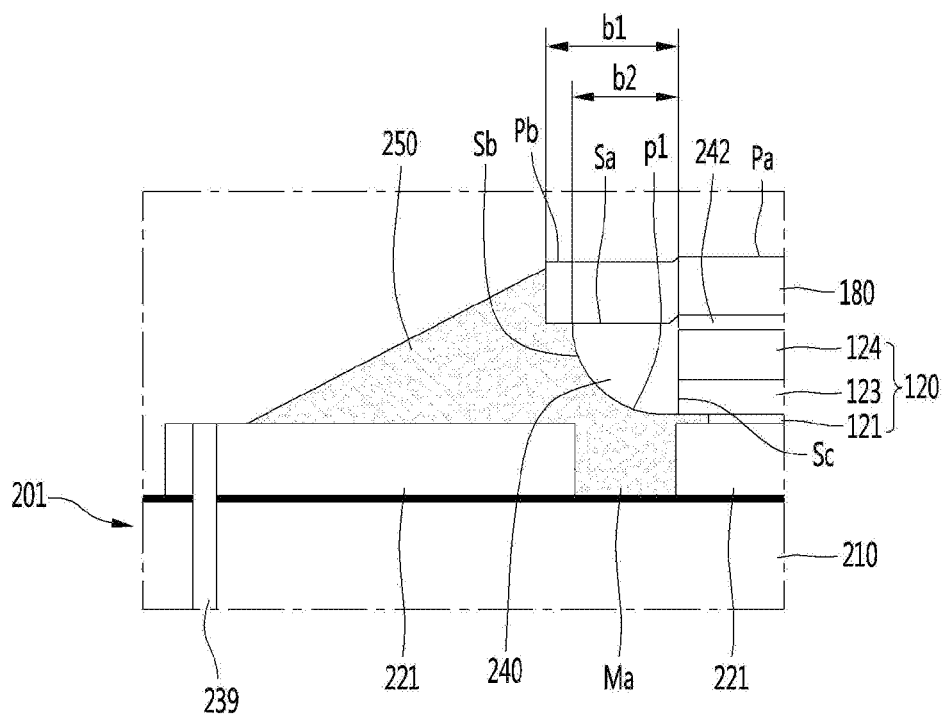
FIG. 5 is another example of the light emitting device package of FIG. 4.

FIG. 5 is another example of the light emitting device package of FIG. 4. In the description of FIG. 5, the same configuration as that described above will be selectively applied with reference to the description above.

Referring to FIG. 5, the phosphor layer 180 may include an inner portion Pa overlapped with the light emitting device 120 in the vertical direction and an outer portion Pb protruding more outer than a side surface of the light emitting device 120 around the inner portion Pa.

The outer portion Pb of the phosphor layer 180 may be drawn toward a lower surface than the inner portion Pa. In this case, the upper surface of the outer portion Pb may be disposed lower than the upper surface of the inner portion Pa. The lower surface of the outer portion Pb may be disposed lower than the lower surface of the inner portion Pa. The upper surface of the outer portion Pb may extend stepwise from the upper surface of the inner portion Pa. The outer portion Pb may overlap the adhesive layer 242 or/and the light emitting device 120 in the horizontal direction. Accordingly, the outer portion Pb of the phosphor layer 180 is adhered to the first resin 250 and the second resin 240, so that the outer portion Pb may be prevented from being separated.

Figure 6:
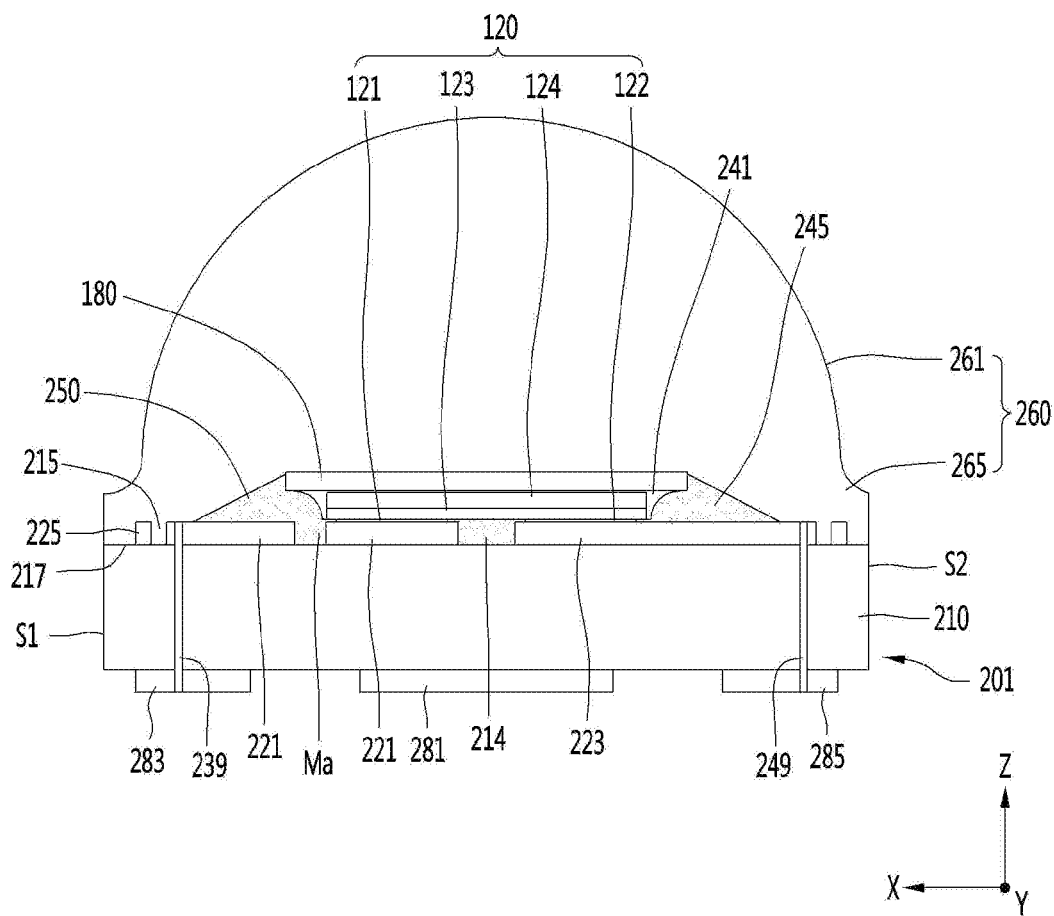
FIG. 6 is a first modified example of the light emitting device package of FIG. 2.
Figure 7:
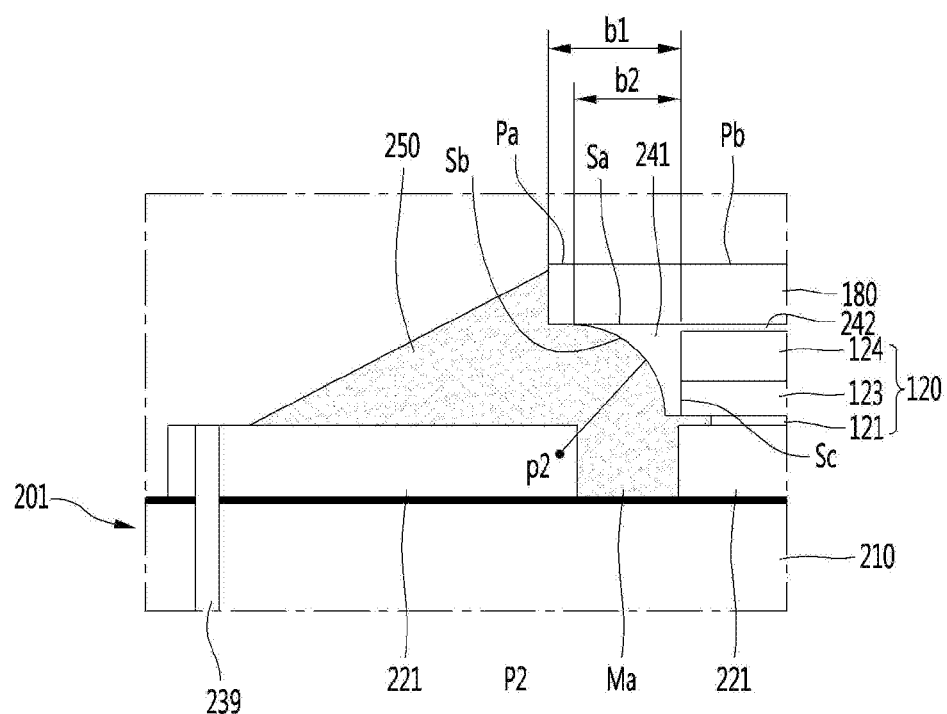
FIG. 7 is a partially enlarged view of the light emitting device package of FIG. 6.

FIG. 6 is a first modified example of the light emitting device package of FIG. 2, and FIG. 7 is a partially enlarged view of FIG. 6. In the description of FIGS. 6 and 7, the same configuration as the description disclosed above will be selectively applied with reference to the description above.

Referring to FIGS. 6 and 7, the second resin 241 may be disposed on the side surface of the light emitting device 120 and the lower surface of the outer side surface of the phosphor layer 180. The second resin 241 may be connected to the adhesive layer 242. The second resin 241 may be disposed between the first resin 250 and the light emitting device 120.

The upper surface Sa of the second resin 241 may contact the lower surface of the phosphor layer 180. The outer surface Sb of the second resin 241 may be in contact with the inner surface of the first resin 250. The inner surface Sc of the second resin 241 may be in contact with the side surface of the light emitting device 120. The second resin 241 may overlap the outer portion of the phosphor layer 180 in the vertical direction. The width b2 of the upper surface Sa of the second resin 241 may be equal to or smaller than the distance b1 of the outer portion of the phosphor layer 180. The width b2 may be 100 micrometers or less, for example, in the range of 50 to 100 micrometers. When the width b2 of the upper surface Sa of the second resin 241 is smaller than the above range, light extraction efficiency may reduce, and when it is larger than the above range, light loss may occur.

The outer surface Sb of the second resin 241 may include a curved surface concave in an inner direction or a diagonal direction between the lower surface of the phosphor layer 180 and the side surface of the light emitting device 120. The entire outer surface Sb of the second resin 241 may be provided as a concave curved surface. The outer surface Sb of the second resin 241 may have a predetermined curvature, and the center p2 of the circle having a radius of curvature of the outer surface Sb may be disposed on an overlapped region with the first resin 250 in the vertical direction. The inner surface of the first resin 250 contacts the outer surface Sb of the second resin 241 and include a convex curved surface. When the inner surface of the first resin 250 is formed as a convex curved surface, the inner surface of the first resin 250 may reflect light incident through the first resin 250 toward the outside of the phosphor layer 180. Since the area of the inner surface of the first resin 250 or the surface facing the side surface of the light emitting device 120 may be increased, light reflection efficiency may be increased.

The second resin 241 may overlap the transparent substrate 124 and the light emitting structure 123 of the light emitting device 120 in the horizontal direction. The second resin 241 may have a gradually thinner width toward the lower portion. Accordingly, light emitted through the side surfaces of the transparent substrate 124 and the light emitting structure 123 is guided through the second resin 241 and reflected by the first resin 250, or may be incident toward the lower surface of the outer portion of the phosphor layer 180.

Figure 8:
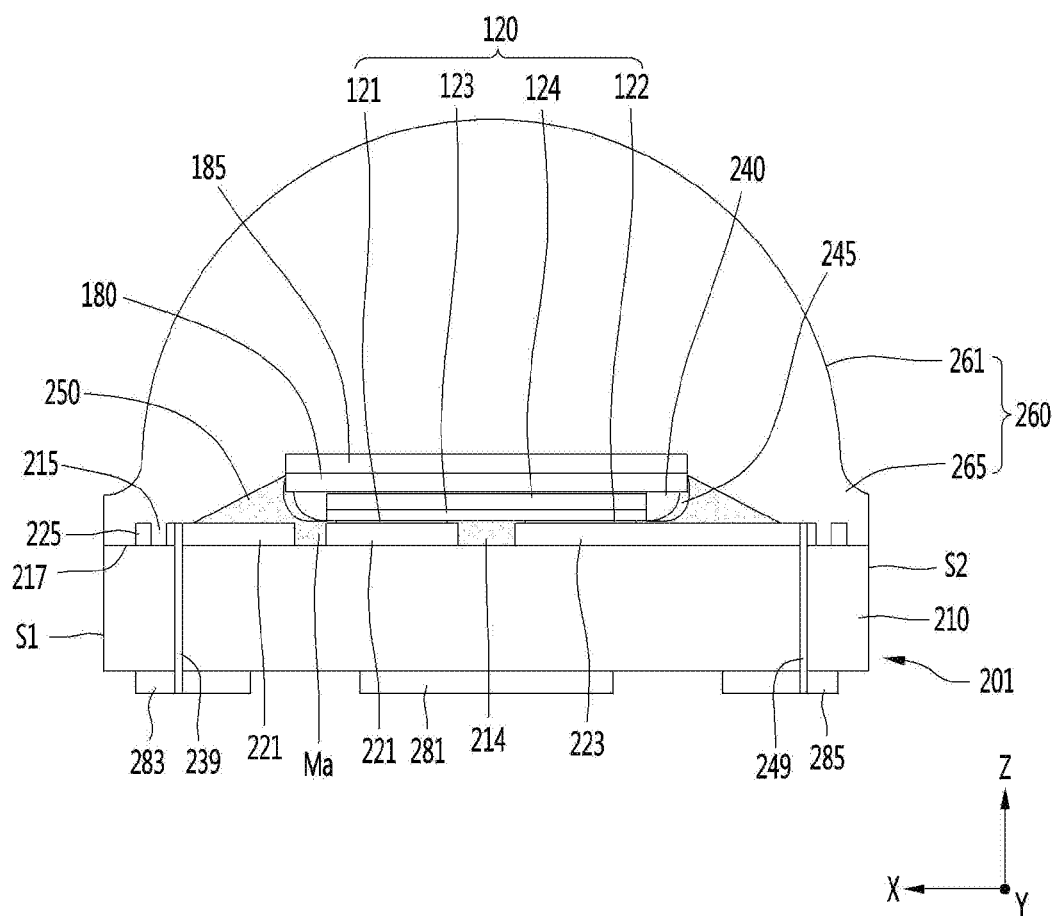
FIG. 8 is a second modified example of the light emitting device package of FIG. 2.

FIG. 8 is a second modified example of the light emitting device package of FIG. 2. In the description of FIG. 8, the same configuration as that described above will be selectively applied with reference to the above description.

Referring to FIG. 8, the light emitting device package includes a light emitting device 120 on a substrate 201, a first resin 250 and a second resin 240 around the light emitting device 120, a phosphor layer 180 on the light emitting device 120, and a resin layer 185 on the phosphor layer 180.

The resin layer 185 may be the same as or different from an area of the upper surface of the phosphor layer 180. The resin layer 185 may be a transparent resin material, for example, a resin material such as UV (Ultra violet) resin, silicone or epoxy. The resin layer 185 may be formed of a transparent resin material, such as a resin material such as UV (Ultra violet) resin, epoxy or silicone. The resin layer 185 may have a refractive index of 1.8 or less, for example, in the range of 1.1 to 1.8 or in the range of 1.4 to 1.6, and may be lower than a refractive index of a diffusion agent. For the UV resin, for example, a resin (oligomeric type) having a urethane acrylate oligomer as a main raw material may be used as the main material. For example, a urethane acrylate oligomer that is a synthetic oligomer may be used.

The resin layer 185 may be free of impurities, or may include impurities such as phosphors or diffusion agents. That is, the resin layer 185 may be provided without impurities for a light flux, or may further include other phosphors to improve color purity.

A third resin 245 may be included between the first resin 250 and the second resin 240. The third resin 245 may be disposed outside the second resin 240 and contact a side surface of the phosphor layer 180. The third resin 245 may be provided in a form surrounding the outer side surface of the second resin 240, and may be in contact with the outer bottom and the side surfaces of the phosphor layer 180. The first resin 250 may be disposed outside the third resin 245. The third resin 245 may provide a convex curved surface in the outer direction.

The third resin 245 may be formed of the same material as the second resin 240 or a transparent material different from the second private resin 240. The third resin 245 may be connected to an adhesive layer (not shown) disposed between the phosphor layer 180 and the resin layer 185.

Figure 9:
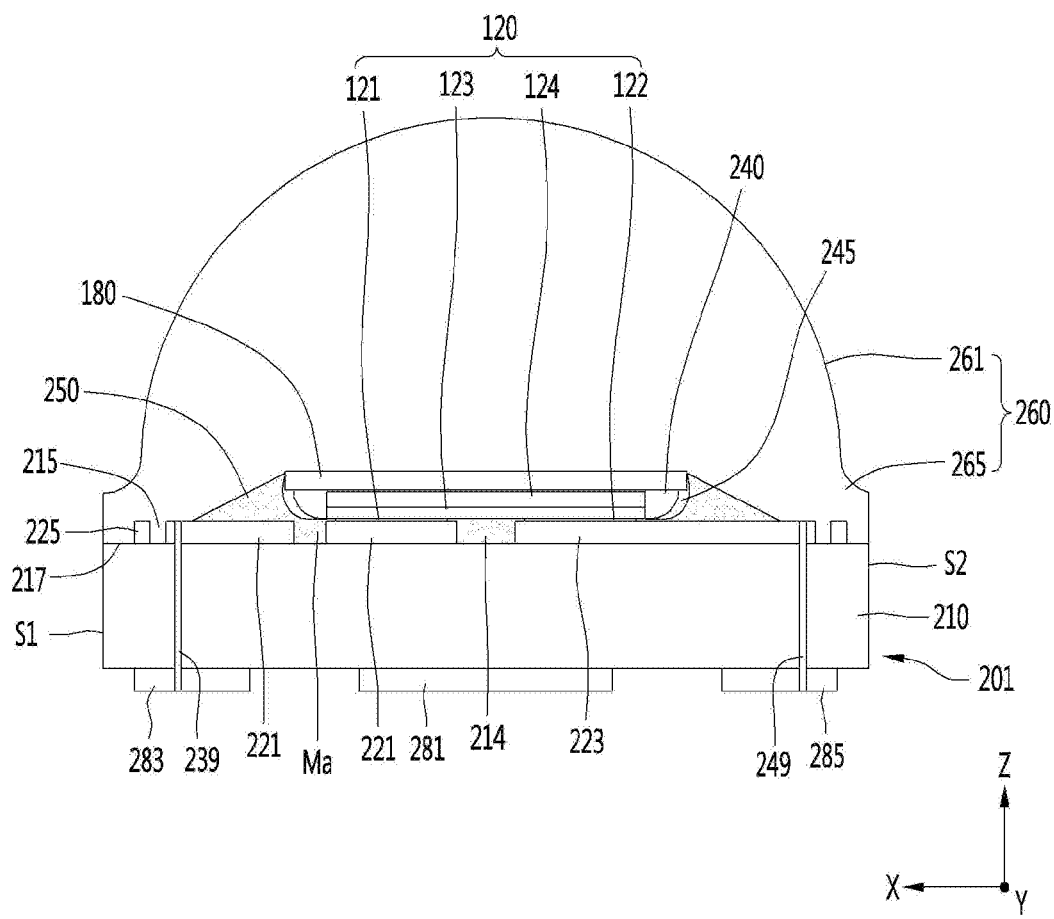
FIG. 9 is an example of a third modification of the light emitting device package of FIG. 2.

The resin layer 185 may be removed as shown in FIG. 9. As shown in FIG. 9, when the resin layer 185 is removed on the phosphor layer 180, the third resin 245 may be disposed between the first resin 250 and the second resin 240, or may be adhered to a side surface and an outer bottom of the phosphor 180. The third resin 245 may guide light emitted in the lateral direction through the light emitting device 120 in a direction more outward than a region of the second resin 240.

FIGS. 10 to 13 are views illustrating a manufacturing process of a light emitting device package according to a first embodiment of the invention.

Figure 10:
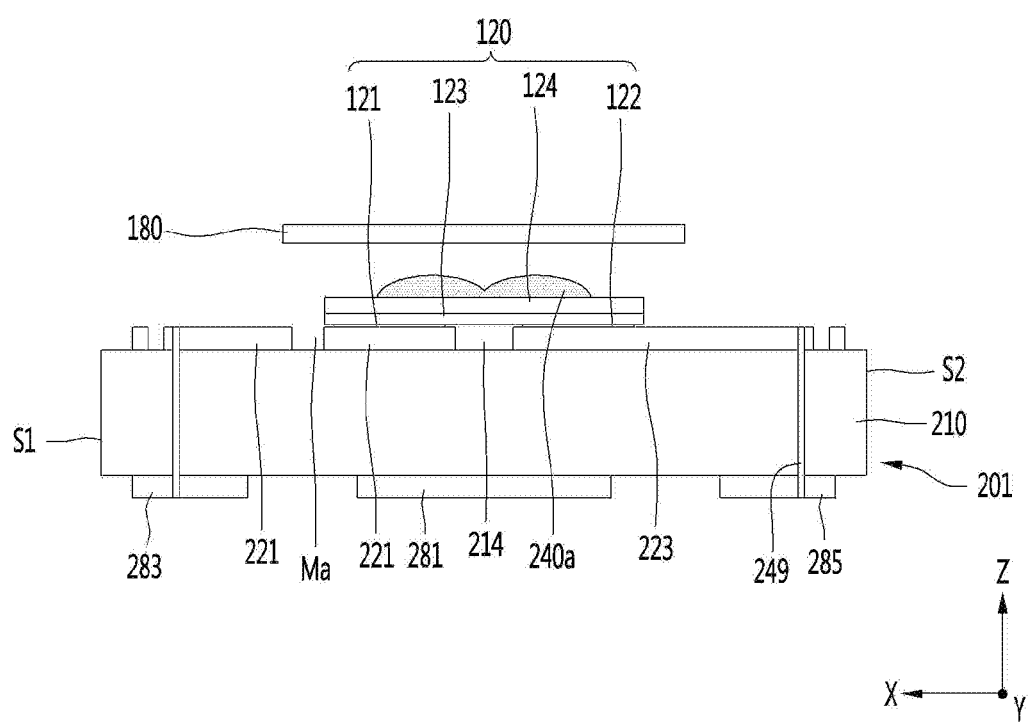
FIGS. 10 to 13 are views illustrating a manufacturing process of a light emitting device package according to an embodiment of the invention.
Figure 11:
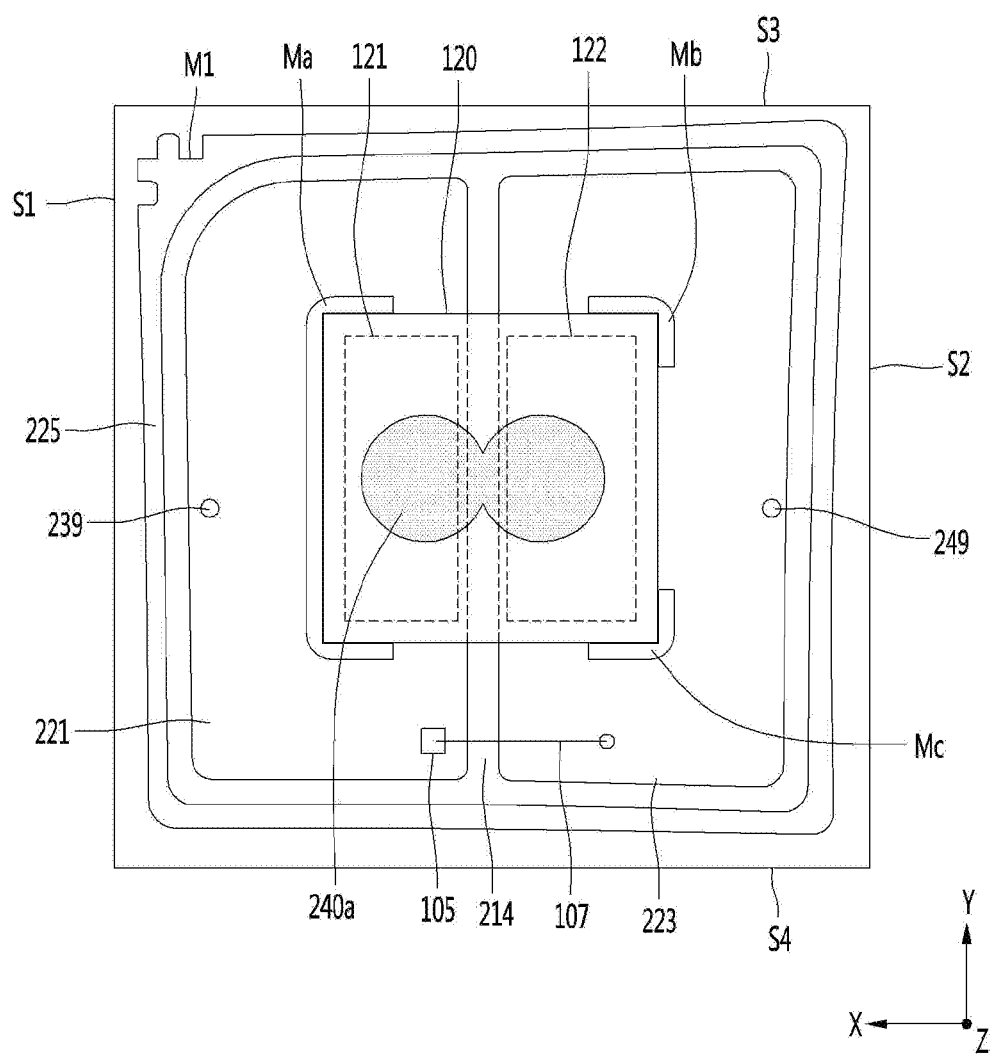

As shown in FIGS. 10 and 11, the first bonding portion 121 and the second bonding portion 122 of the light emitting device 120 are bonded onto the first frame 221 and the second frame 223 of the substrate 201. Each corner of the light emitting device 120 may be disposed in an region of the first, second and third recesses Ma, Mb, and Mc of the first frame 221 and the second frame 223 along the first, second and third recesses Ma, Mb, and Mc, as shown in FIG. 11.

When the light emitting device 120 is mounted, a liquid resin 240a is dispensed on the upper surface of the light emitting device 120. At this time, the liquid resin 240a may be dispensed one or more times so that the light emitting device 120 may be diffused in a uniform distribution over the entire region.

Thereafter, a phosphor layer 180 is corresponded on the light emitting device 120. At this time, the phosphor layer 180 may be provided in the form of a pre-made film. The phosphor layer 180 is pressed and attached in the direction of the light emitting device 120. The phosphor layer 180 may be attached to the light emitting device 120 by the liquid resin 240a. At this time, most of the liquid resin 240a is diffused by pressurization on the light emitting device 120, and may be extended to the side surface of the light emitting device 120. The liquid resin extending to the side surface of the light emitting device 120 may be cured to become a second resin. At this time, the outer surface of the second resin may be formed of a curved surface having a surface curvature and a predetermined curvature between the phosphor layer and the side surface of the light emitting device.

Figure 12:
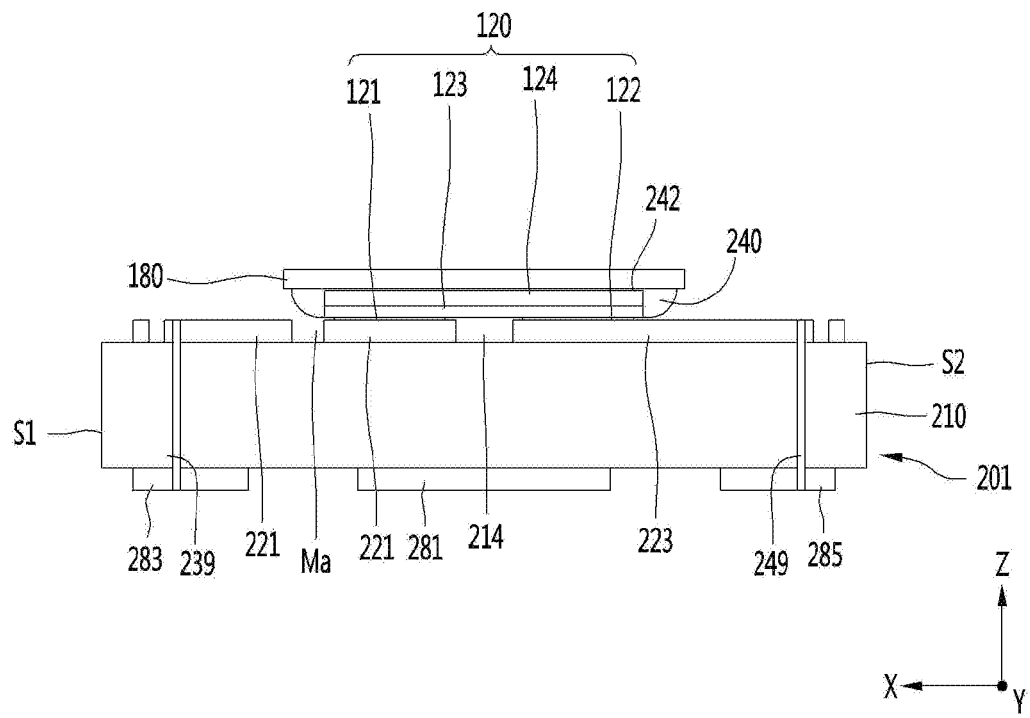

As shown in FIG. 12, the liquid resin is cured with the second resin 240, and the liquid resin may have a convex outer surface depending on the amount of dispensed and the degree of pressure of the phosphor layer 180. In addition, the liquid resin may contact the lower surface of the phosphor layer 180 and a side surface of the light emitting device 120.

The second resin 240 is provided as a transparent layer under the side surface of the light emitting device 120 and the outer portion of the phosphor layer 180 to guide light.

Figure 13:
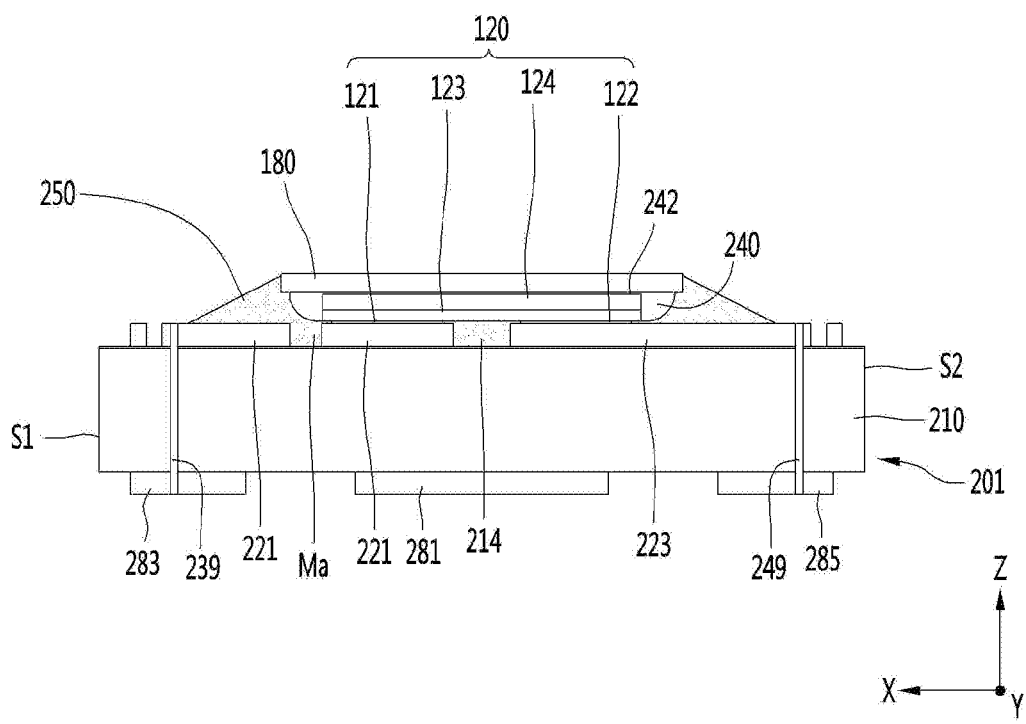

As shown in FIG. 13, the first resin 250 may be dispensed around the light emitting device 120. The first resin 240 may be dispensed along the first frame 221 and the second frame 223 of the substrate 201 from outside the light emitting device 120. The first resin 250 may move to the side surface of the phosphor layer 180 on the second resin 240. The first resin 250 may be extended by a capillary phenomenon to a region between the lower surface of the light emitting device 120 and the substrate 201.

Subsequently, a process of forming an optical lens is performed, and a unit package size is cut.

Figure 14:
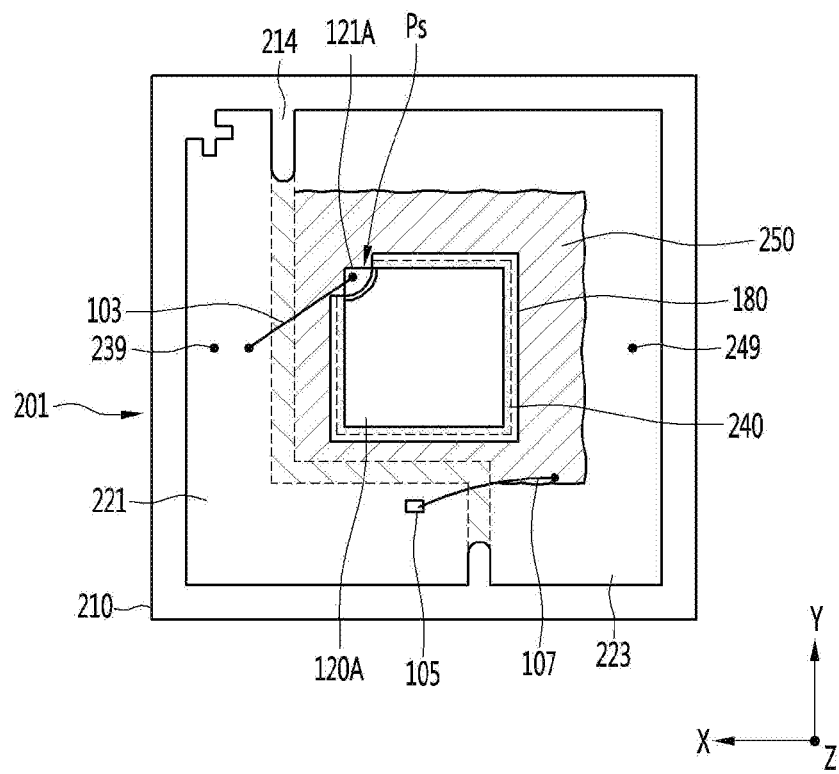
FIG. 14 is a plan view showing another example of a light emitting device package according to a first embodiment of the invention.

FIG. 14 is a view showing a substrate on a substrate without an optical lens as another example of the light emitting device package of FIG. 1.

Referring to FIG. 14, the light emitting device 120A may be a vertical LED chip. The light emitting device 120A may be disposed on the second frame 223, and the first bonding portion 121A of an upper portion thereof may be connected to the first frame 221 and the wire 103. The lower portion of the light emitting device 120A may be electrically connected to the second frame 223.

A phosphor layer 180 may be disposed on the light emitting device 120A. At this time, the phosphor layer 180 may be disposed on a region except for the electrode region Ps to which the first bonding portion 121A of the light emitting device 120 is exposed.

The second resin 240 may be disposed around the light emitting device 120A. In this case, the second resin 240 may be disposed along the lower surface of the outside portion of the phosphor layer 180. A portion of the second resin 240 is exposed outside the phosphor layer 180 and may be disposed on the electrode region Ps.

The first resin 250 may cover a portion of the first frame 221 and the second frame 223 and may cover the periphery of the second resin 240 outside the light emitting device 120A.

The first gap region 214 may be provided in a groove shape that is bent at least once or twice between the first frame 221 and the second frame 223. The third frame on the substrate may be removed.

Second Embodiment

Figure 15:
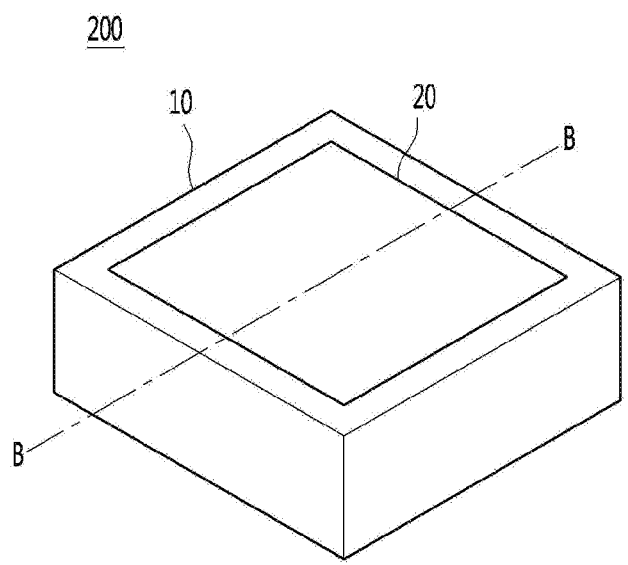
FIG. 15 is a perspective view of a light emitting device package according to a second embodiment of the invention.
Figure 16:
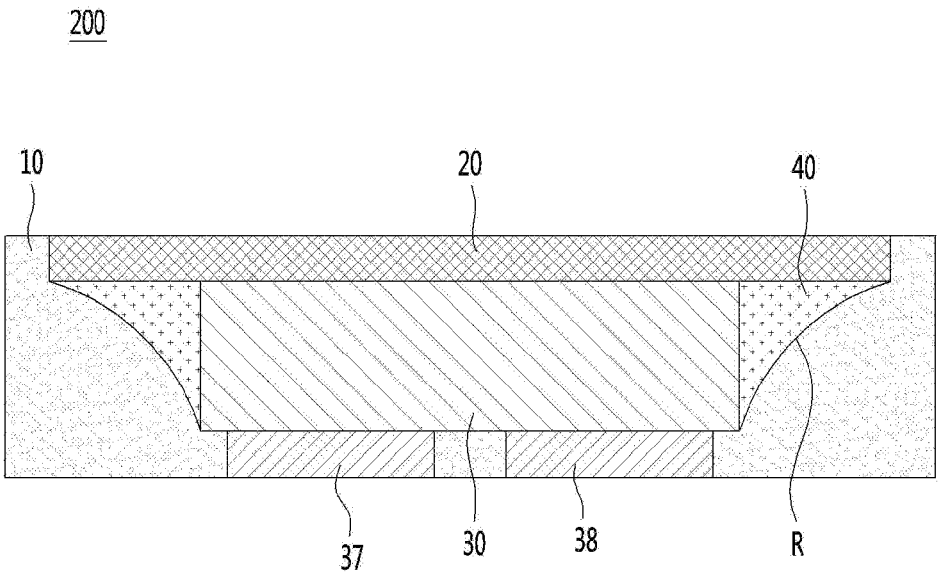
FIG. 16 is a cross-sectional view taken along the line B-B of the light emitting device package of FIG. 15.
Figure 17:
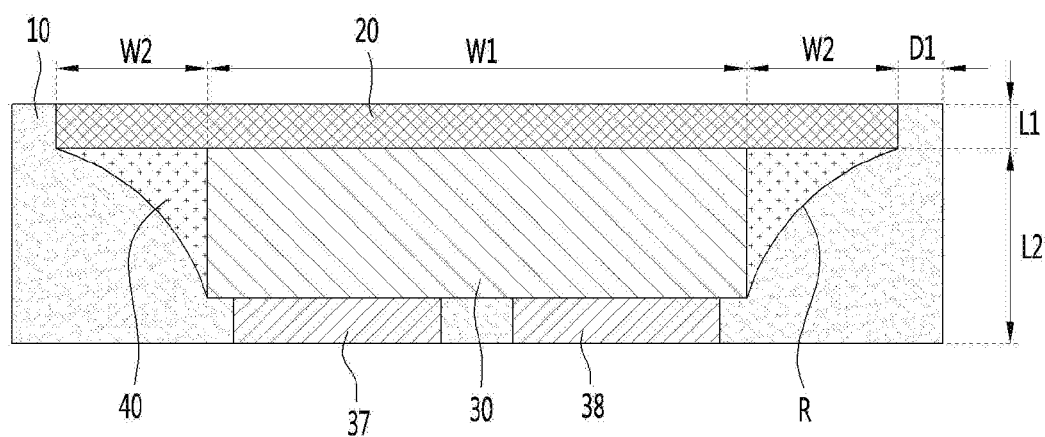
FIG. 17 is a detailed view of the light emitting device package of FIG. 16.

FIG. 15 is a perspective view of a light emitting device package according to a second embodiment of the invention, FIG. 16 is a cross-sectional view taken along the B-B side of the light emitting device package of FIG. 15, and FIG. 17 is a detailed view of the light emitting device package of the FIG. 16.

Referring to FIGS. 15 to 17, the light emitting device package 200 according to the second embodiment may include a light emitting device 30, a first resin 10, a second resin 40, and a phosphor layer 20.

The light emitting device 30 may be a semiconductor device, for example, an LED chip. As another example, the semiconductor device may include an electronic device such as a light receiving device, and the light emitting device may be a device that emits UV light or a device that emits blue light. The light emitting device 30 may be a flip-chip type device. The flip-chip type device may emit light in six side directions.

Figure 25:
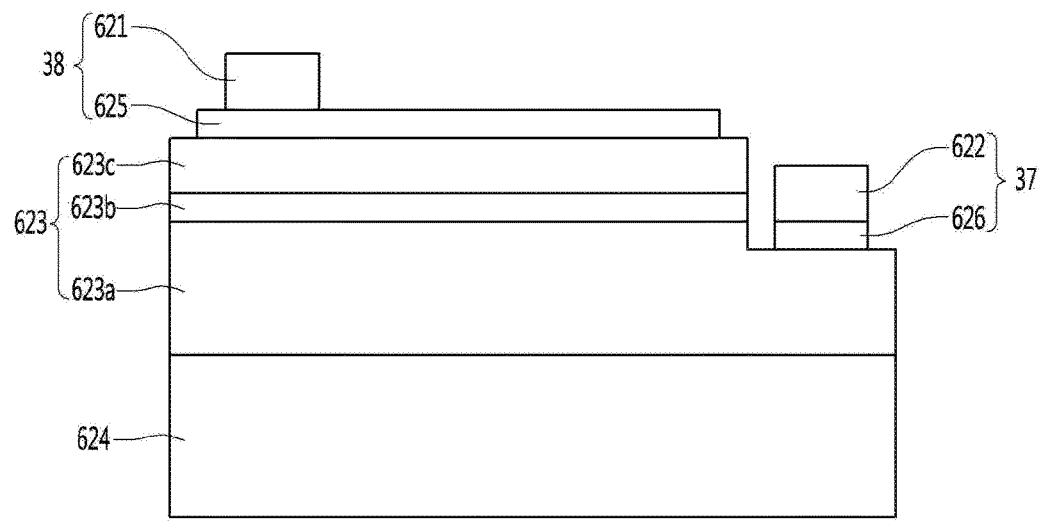
FIG. 25 is a view showing an example of a light emitting device in a light emitting device package according to an embodiment of the invention.

Referring to FIG. 25, an example of a light emitting device will be described. The light emitting device 30 may include a transparent substrate 624, a light emitting structure 623, a first electrode 37 and a second electrode 38, as shown in FIG. 25. A transparent substrate 624 may be disposed under the light emitting structure 623. The transparent substrate 624 may be selected from the group comprising sapphire substrate ($Al_2O_3$)), SiC, GaAs, GaN, ZnO, Si, GaP, InP, and Ge.

The light emitting structure 623 may include a first conductivity type semiconductor layer 623a, the second conductivity type semiconductor layer 623c, and an active layer 623b between the first conductivity type semiconductor layer 623a and the second conductivity type semiconductor layer 623c. The light emitting structure 623 may be provided as a compound semiconductor. The light emitting structure 623 may be provided as, for example, compound semiconductors of Group II-VI elements or a Group III-V elements. For example, the light emitting structure 623 may include at least two or more elements selected from aluminum (Al), gallium (Ga), indium (In), phosphorus (P), arsenic (As), and nitrogen (N). The first and second conductivity type semiconductor layers 623a and 633c may be embodied as at least one of compound semiconductors of Group III-V elements or Group II-VI elements. The first and second conductivity type semiconductor layers may be formed of, for example, a semiconductor material having a composition formula of $In_xAl_yGa_{1-x-y}N$ ($0 \leq x \leq 1$, $0 \leq y \leq 1$, $0 \leq x+y \leq 1$). For example, the first and second conductivity type semiconductor layers 623a and 623c may include at least one selected from the group including GaN, AlN, AlGaN, InGaN, InN, InAlGaN, AlInN, AlGaAs, GaP, GaAs, GaAsP, AlGaInP, and the like.

The first conductivity type semiconductor layer 623a may be an n-type semiconductor layer doped with n-type dopants such as Si, Ge, Sn, Se, and Te. The second conductivity type semiconductor layer 623c may be a p-type semiconductor layer doped with p-type dopants such as Mg, Zn, Ca, Sr, and Ba. The active layer 623b may be embodied as at least one of a compound semiconductor of Group III-V elements or Group II-VI elements. When the active layer 623b is implemented as a multi-well structure, the active layer 623b may include a plurality of alternating well layers and a plurality of barrier layers, and may be disposed of a semiconductor material having a composition formula of $In_xAl_yGa_{1-x-y}N$ ($0 \leq x \leq 1$, $0 \leq y \leq 1$, $0 \leq x+y \leq 1$). For example, the active layer 623b may include at least one selected from the group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

The first electrode 37 and the second electrode 38 may be disposed on one surface of the light emitting structure 623. The first electrode 37 and the second electrode 38 may be disposed at a distance from each other. The first electrode 37 may include a first pad electrode 622 and a first branch electrode 626. The first electrode 37 may be electrically connected to the first conductivity type semiconductor layer 623a. The second electrode 38 may include a second pad electrode 621 and a second branch electrode 625. The second electrode 38 may be electrically connected to the first conductivity type semiconductor layer 623c. The first electrode 37 and the second electrode 38 may be formed in a single layer or multi-layer structure. For example, the first electrode 37 and the second electrode 38 may be ohmic electrodes. For example, the first electrode 37 and the second electrode 38 may be at least one or alloys of two or more materials of ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf.

A protective layer may be further provided on the light emitting structure 623. The protective layer may be provided on the upper surface of the light emitting structure 623. The protective layer may be provided on the side surface of the light emitting structure 623. The protective layer may be provided to expose the first pad electrode 622 and the second pad electrode 621. The protective layer may be selectively provided on the periphery and the lower surface of the transparent substrate 624. For example, the protective layer may be provided as an insulating material. For example, the protective layer may be formed of at least one material selected from the group including SixOy, SiOxNy, SixNy, and AlxOy.

In the light emitting device 30 according to the invention, light generated in the active layer 623b may be emitted in six side directions of the light emitting device 30. The light generated in the active layer 623b may be emitted in six side directions through the upper surface, lower surface, and four side surfaces of the light emitting device 30.

Referring to FIG. 16, in the light emitting device package 200, the first resin 10 may be disposed on the side surface of the light emitting device 30. The first resin 10 may be a reflective member or a reflective resin member, and the first embodiment will be referred to. The first resin 10 reflects the side light of the light emitting device 30, and the reflected light may be introduced back into the light emitting device 30 or emitted to one surface of the phosphor layer 20. The first resin 10 may include, but is not limited to, at least one of epoxy resin, polyimide resin, urea resin, and acrylic resin.

The first resin 10 may include a reflective material, for example, the reflective material may be $TiO_2$ or $SiO_2$. The lower surface of the first resin 10 may be disposed on the same plane as the lower surface of the first electrode 37 and the second electrode 38 of the light emitting device 30. The first resin 10 may include a first side surface close to a side surface of the light emitting device 30 and a second side surface facing the first side surface. The first side surface or the second side surface may have a curvature R with respect to one side surface of the first resin 10.

The first resin 10 may be disposed on the outer periphery and the lower portion of the light emitting device 30. Among the inner surfaces of the first resin 10, surfaces facing the side surfaces of the light emitting device 30 may be provided as curved surfaces having a curvature R. The curved surface may include a curved surface that is convex in the lateral direction of the light emitting device 30. The inner curved surface or inner surface of the first resin 10 may be closest to the lower periphery of the light emitting device 30 and may be spaced farthest from the upper periphery of the light emitting device 30. As the inner curved surface of the first resin 10 is adjacent to the phosphor layer 20, the distance from the side surface of the light emitting device 30 may gradually increase. The inner curved surface of the first resin 10 may be connected between a lower side surface of the light emitting device 30 and a lower side surface of the phosphor layer 20.

The light emitted from the side surface of the light emitting device 30 through the curvature R of the inner curved surface included in the first resin 10 is reflected in the direction of the phosphor layer 20 and the light extraction efficiency may be increased.

The lower portion of the first resin 10 may be disposed lower than the side surface of the light emitting device 30. The first resin 10 may contact side surfaces of the first electrode 37 and the second electrode 38. The first resin 10 may contact the lower surface of the light emitting device 30.

The upper portion of the first resin 10 may be disposed higher than the other surface or the upper surface of the light emitting device 30. The upper surface of the first resin 10 may be disposed on a horizontal surface such as the other surface or the upper surface of the phosphor layer 20. The first resin 10 may be disposed around the light emitting device 10 and around the phosphor layer 20.

The outer side surface of the first resin 10 may be provided as a vertical surface, or may be provided as a surface having an inclination or curvature.

The second resin 40 may be disposed between the inner curved surface of the first resin 10 and the side surface of the light emitting device 30. The second resin 40 may include a transparent material. The second resin 40 may include an outer curved surface in contact with the inner curved surface of the first resin 10. In the distance between the outer surface of the second resin 40 from the side surface of the light emitting element 30, the distance from the lower end of the side surface of the light emitting device 30 in the second resin 40 may be the smallest, and the distance from the upper end of the side surface of the light emitting device 30 in the second resin 40 may be the largest.

The curvature of the outer curved surface of the second resin 40 may include a curvature corresponding to the curvature R. Since the path through which the light incident from the light emitting device 30 is emitted is shortened through the curvature R, light extraction characteristics of the light emitting device package may be improved.

The second resin 40 may be disposed between the inner surface of the first resin 10 and the side surface of the light emitting device 30. The second resin 40 may be disposed between the first resin 10 and the light emitting device 30 to surround the light emitting device 30. The second resin 40 may be disposed to surround the entire side surface of the light emitting device 30. The second resin 40 may be disposed on four sides of the light emitting device 30.

As another example, the second resin 40 may be disposed in a portion of the lower surface of the light emitting device 30. In the process in which the second resin 40 is disposed on the side surface of the light emitting device 30, the second resin 40 may be disposed between an outer surfaces of the first electrode 37 and the second electrode 38 included in the light emitting device 30 and the light emitting structure 33. The first electrode 37, the second electrode 38, and the light emitting structure 33 contacting the second resin 40 and the second resin 40 do not affect each other.

The second resin 40 may have a refractive index different from that of the light emitting device 30. The second resin 40 may have a refractive index lower than that of the light emitting structure. The second resin 40 has a refractive index that is less than or equal to the refractive index of the light emitting device 30, thereby improving the extraction efficiency of light emitted from the light emitting device package to the outside.

The second resin 40 may include at least one of epoxy resin, silicone resin, polyimide resin, urea resin, and acrylic resin, but is not limited thereto.

Light incident in the second resin 40 from the light emitting device 30 due to refraction of light generated at the interface between the light emitting device 30 and the second resin 40 diffuses in the second resin 40. As a result, the uniformity of light intensity may be improved on the emitting surface of the light emitting device package.

The phosphor layer 20 may be disposed on the light emitting device 30. The phosphor layer 20 may be disposed on the upper surface of the light emitting device 30 and the second resin 40. When the light incident from the light emitting device 30 to the phosphor layer 20 is emitted to the outside, the phosphor layer 20 may convert the wavelength of the light emitted to the outside.

The phosphor layer 20 may be formed of a polymer resin containing a wavelength conversion material. The polymer resin may include at least one of permeable epoxy resin, silicone resin, polyimide resin, urea resin, and acrylic resin, but is not limited thereto. The wavelength conversion material may be a phosphor. The wavelength conversion material may include one or more of sulfide-based, oxide-based, or nitride-based compounds, but is not limited thereto. The phosphor may be variously selected to realize a color desired by the user.

For example, when the light emitting device 30 emits light in the ultraviolet wavelength range, the green phosphor, the blue phosphor, and the red phosphor may be selected as the phosphor. When the light emitting device 30 emits light of a blue wavelength band, a combination of a yellow phosphor or a red phosphor and a green phosphor or a combination of a yellow phosphor, a red phosphor and a green phosphor may be selected.

The phosphor layer 20 may have a top view shape in a circular shape or a polygonal shape. The center region of the phosphor layer 20 may overlap the light emitting device 30 in the vertical direction, thereby improving wavelength conversion efficiency. The outer region of the phosphor layer 20 may overlap the second resin 40 in the vertical direction, thereby converting the wavelength of light emitted through the side surface of the light emitting device 30. The lower surface of the outer region of the phosphor layer 20 may be disposed on the same plane as the upper surface of the light emitting device 30 or may be disposed lower than the upper surface of the light emitting device 30.

Referring to FIG. 17, the phosphor layer 20 and the first resin 10 according to the invention will be described in detail. In the phosphor layer 20, the center region disposed on the upper surface of the light emitting device 30 may be referred to as the a region, and the outer region disposed on the upper surface of the second resin 40 may be defined as the b region. The 'a' region may convert the wavelength of light incident on the upper surface of the light emitting device 30. The horizontal width W1 of the 'a' region may be the same as the horizontal width of the light emitting device 30. The horizontal width W1 of the 'a' region may range from 650 µm to 2000 µm. The horizontal width W1 of the 'a' region may be determined by the horizontal width of the light emitting device 30 within the above-described range. The 'b' region may extend from the upper surface of the second resin 40 to the outer surface of the first resin 10. The 'b' region may convert the wavelength of light incident on the side surface of the light emitting device 30.

The horizontal width W2 of the 'b' region may be in a range of 1:1 to 1:1.1 compared to the horizontal width of the upper surface of the second resin 40. The horizontal width W2 of the 'b' region may range from 200 µm to 600 µm. When the horizontal width W2 of the 'b' region is 200 µm or more, light conversion efficiency of the light emitting device package may be secured. When the horizontal width W2 of the 'b' region is 600 µm or less, a process yield of the light emitting device package may be secured.

The first resin 10 may be disposed surrounding the side surface of the phosphor layer 20 and the side surface of the light emitting device 30. The first resin 10 may be disposed surrounding a sider surface of the phosphor layer 20 and the second resin 40. By arranging the first resin 10 around the side surface of the phosphor layer 20, moisture resistance and color uniformity of the light emitting device package may be improved.

The first resin 10 may include a region in contact with a side surface of the phosphor layer 20. The horizontal direction width D1 of the region where the first resin 10 and the phosphor layer 20 are in contact may be in the range of 30 µm to 500 µm. When the horizontal width D1 of the region where the first resin 10 and the phosphor layer 20 are in contact with each other is 30 µm or more, light leaking from the side surface of the phosphor layer 20 is blocked and the color uniformity of the light emitting device package may be improved. When the horizontal direction width D1 of the region where the first resin 10 and the phosphor layer 20 are in contact with each other is 500 µm or less, a process yield of the light emitting device package may be secured.

The first resin 10 may include a first region disposed on the side surface of the phosphor layer 20 and a second region disposed on the side surface of the light emitting device 30. Through the first region, the moisture resistance of the light emitting device package is improved, thereby improving light uniformity in the light output area of the light emitting device package. The thickness L1 of the first region may range from 30 µm to 300 µm. When the thickness L1 of the first region is 30 µm or more, reliability and color uniformity of the light emitting device package may be improved. When the thickness L1 of the first region is 300 µm or less, a process yield of the light emitting device package may be secured. The thickness L2 of the second region may range from 130 µm to 400 µm. When the thickness L2 of the second region is 130 µm or more, it is possible to secure light conversion efficiency on the side surface of the light emitting device package. When the thickness L2 of the second region is 400 µm or less, a manufacturing yield of the light emitting device package may be secured.

The thickness L1 of the first region may be smaller than the thickness L2 of the second region. The thickness L1 of the first region may be in the range of 1:0.3 to 1:0.75 compared to the thickness L2 of the second region. When the thickness L1 of the first region is 1:0.3 or more compared to the thickness L2 of the second region, light conversion efficiency of the side surface of the light emitting device package may be improved. When the thickness L1 of the first region is 1:0.75 or less compared to the thickness L2 of the second region, the process yield of the light emitting device package may be improved.

A step portion may be disposed between the first region and the second region of the first resin 10. Since the first resin 10 is disposed around the side surface of the phosphor layer 20 through the step portion, it is possible to improve the efficiency of light emitted from the side surface of the light emitting device 30.

Figure 18:
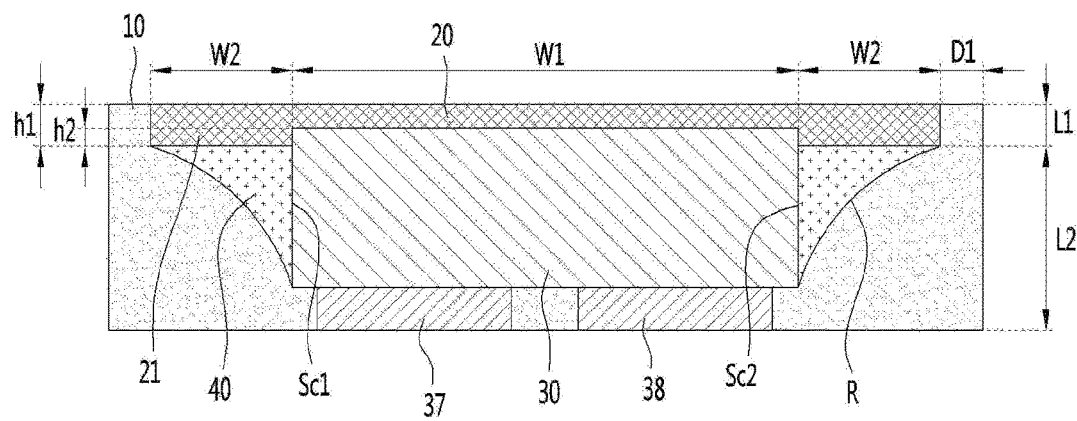
FIG. 18 is an example of a first modification of the light emitting device package of FIG. 17.
Figure 20A:
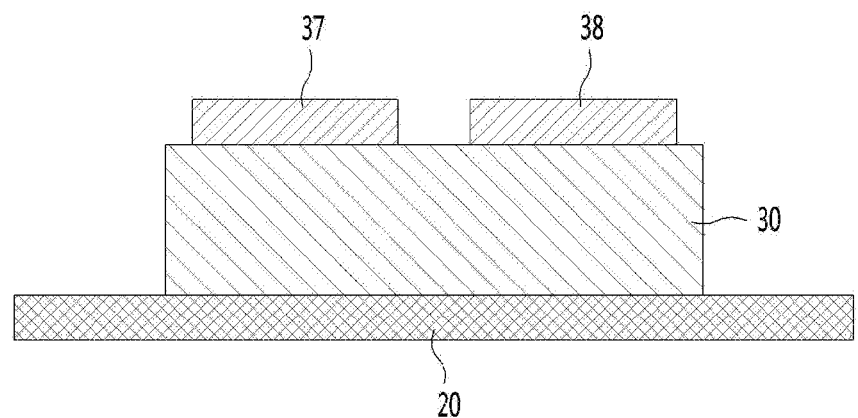
Figure 20B:
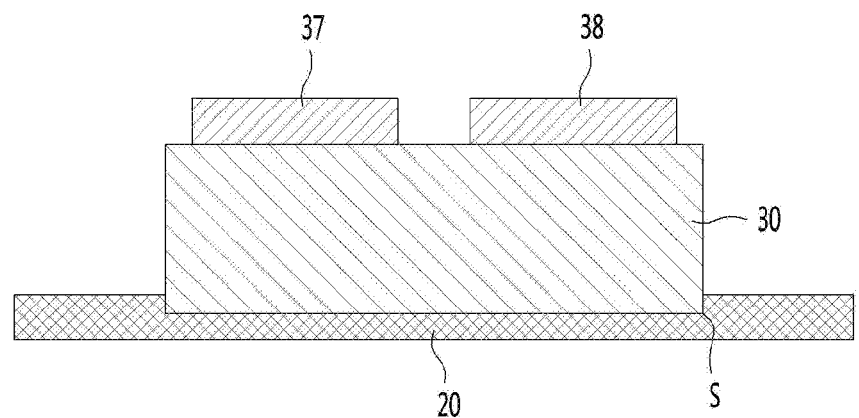

Referring to FIG. 18 and FIG. 20B, the phosphor layer 20 including the recess S will be described. The phosphor layer 20 may be disposed on the light emitting device 30. The phosphor layer 20 may be disposed on the upper surface of the light emitting device 30 and the second resin 40. When the light incident from the light emitting device 30 to the phosphor layer 20 is emitted to the outside, the phosphor layer 20 may convert the wavelength of the light emitted to the outside. The phosphor layer 20 may include the recess S recessed in a direction from a lower surface to an upper surface. The recess S may overlap the light emitting device 30 in the vertical direction. The recess S may be disposed concavely in the direction of the upper surface of the phosphor layer 20 based on the upper surface of the light emitting device 30. The depth of the recess S may be 50% or less of the thickness of the phosphor layer 20. The recess S may have an upper portion of the transparent substrate. The lower surface area of the recess S may be the same as the upper surface area of the light emitting device 30 or may be disposed in a range of 100% to 120% than the upper surface area of the light emitting device 30. The phosphor layer 20 may include an 'a' region (center region) on which the upper portion of the light emitting device 30 is disposed and a 'b' region (outer region) disposed on the upper surface of the second resin 40. The 'a' region is a region where the recess S is disposed, and the 'b' region is a region extending from the upper surface of the second resin 40 to the outer surface of the first resin 10. Referring to FIGS. 18 and 20, the thickness h2 of the recess S may range from 0.1 to 0.5 compared to the thickness h1 of the phosphor layer 40. When the thickness h2 of the recess S is 0.1 or more compared to the thickness h1 of the phosphor layer 40, the reliability of the light emitting device package may be secured due to the arrangement of the recess S. When the thickness h2 of the recess S is 0.5 or less compared to the thickness h1 of the phosphor layer 40, the light conversion efficiency of the light emitting device package may be secured by the thickness h1 of the phosphor layer 40 disposed on the upper surface of the light emitting device 30. The light emitting device 30 may be disposed in the recess S. A portion of the transparent substrate included in the light emitting device 30 may be disposed in the recess S. As the light emitting device 30 is disposed in the recess S, the light emitting device 30 and the phosphor layer 20 are firmly disposed, thereby improving reliability of the light emitting device package. As the recess S is provided, light conversion efficiency of the light emitting device package may be improved by efficiently converting side light of the light emitting device 30 in the phosphor layer 20.

Here, as shown in FIG. 18, since the inner surfaces Sc1 and Sc2 of the second resin 40 disposed on the side surface of the light emitting device 30 face the curved surface having a curvature on the inner surface of the first resin 10, light emitted in the lateral direction through the inner surfaces Sc1 and Sc2 of the second resin 40 may be reflected in the direction of the phosphor layer 20 by the inner curved surface of the first resin 10. The upper surface of the second resin 40 may be disposed lower than the upper surface of the light emitting device 30. The outer lower portion 21 of the phosphor layer 20 may have a stepped structure from the upper surface of the light emitting device 30 and may protrude in the direction of the lower surface of the first resin 30. The stepped structure of the outer lower portion 21 may be stepped, inclined, or curved with a vertical plane.

A method for manufacturing a light emitting device package according to a second embodiment will be described with reference to FIGS. 19 to 23. In describing the method for manufacturing a light emitting device package according to the invention, detailed description of the overlapping configuration from the contents described with referring to FIGS. 16 to 18 is omitted.

Figure 19:
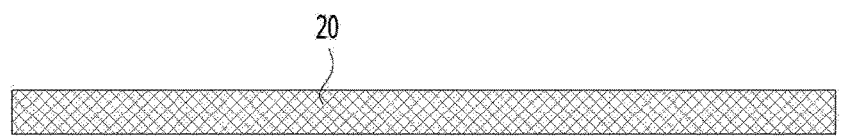
FIGS. 19 to 23 are views illustrating a manufacturing process of the light emitting device package of FIG. 16.

In the method of manufacturing a light emitting device package according to the invention, a chip scale package process is applied. FIGS. 19 and 20, the phosphor layer 20 may be disposed. Although only one phosphor layer 20 is provided as an example, a plurality of phosphor layers 20 may be disposed.

One or a plurality of phosphor layers 20 may be arranged in a film form. The phosphor layer 20 may be formed of a polymer resin film containing a wavelength conversion material. The polymer resin may include at least one of permeable epoxy resin, silicone resin, polyimide resin, urea resin, and acrylic resin, but is not limited thereto.

Referring to (a) of FIG. 20, the light emitting device 30 may be disposed on the phosphor layer 20. The light emitting device 30 may be attached to the phosphor layer 20 through a heat and pressure process. The light emitting devices 30 are attached to the plurality of phosphor layers 20, respectively, so that a light emitting device array may be manufactured. For example, the light emitting device 30 may be disposed on the phosphor layer 20 through a lamination process. The light emitting device 30 may be attached by heating and pressing a resin film through the lamination process.

The resin film constituting the phosphor layer 20 may be silicon composed only of a coupler. The silicone is composed of only a coupler, and does not discolor or crack due to heat. When the temperature, the pressurization pressure, and the pressurization time are adjusted, lamination proceeds between the light emitting device 30 and the phosphor layer 20, and may be attached to each other. When heated in the phosphor layer 20, the viscosity is increased to have flowability. After the light emitting device 30 is disposed on the phosphor layer 20 having flowability, it may be firmly attached when it is cured over time.

As another example, referring to (b) of FIG. 20, the recess S may be disposed on the phosphor layer 20 overlapping the outer surface of the light emitting device 30 by adjusting the pressing time. After the light emitting device 30 is disposed, when the pressing time is increased, the recess S is formed in the phosphor layer 20 by gravity by the light emitting device 30 and may be firmly disposed. Since the light emitting device 30 is disposed in the recess S, the light emitting device 30 and the phosphor layer 20 may be disposed more firmly.

Figure 21:
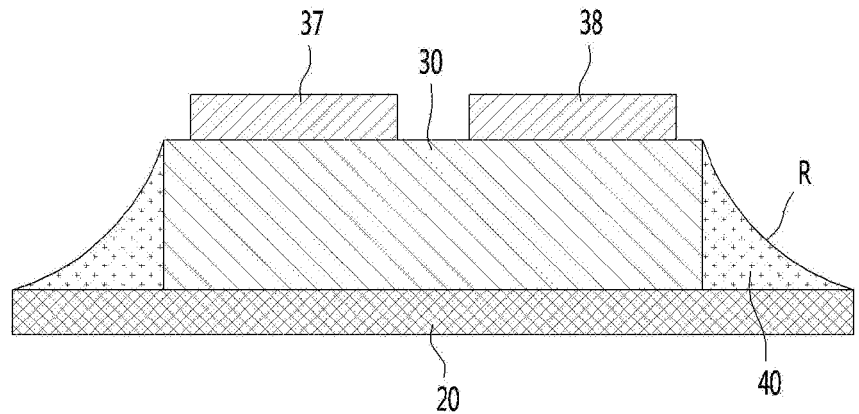

Referring to FIG. 21, the second resin 40 may be disposed on a side surface of the light emitting device 30. The second resin 40 may be disposed on four side surfaces of the light emitting device 30. The second resin 40 may be disposed in a partial region of the lower surface of the light emitting device 30. Through the process in which the second resin 40 is disposed on the side surface of the light emitting device 30, the second resin 40 may be disposed between the light emitting structure and the side surfaces of the first electrode 37 and the second electrode 38 included in the light emitting device 30. The second resin 40 and the first electrode 37, the second electrode 38, and the light emitting structure contacting the second resin 40 do not affect each other. The second resin 40 may have a refractive index different from that of the light emitting device 30. For example, the refractive index of the second resin 40 may be less than or equal to the refractive index of the light emitting device 30. The second resin 40 may include at least one of epoxy resin, silicone resin, polyimide resin, urea resin, and acrylic resin, but is not limited thereto.

The second resin 40 may be disposed through dispensing. The second resin 40 may be arranged with a curvature R formed in a direction in which the phosphor layer 20 is disposed by gravity while the vertical cross-section of the second resin 40 is fixed in a triangular shape. Since the path through which the light incident from the light emitting device 30 is emitted is shortened through the curvature R, light extraction characteristics of the light emitting device package may be improved.

Figure 22:
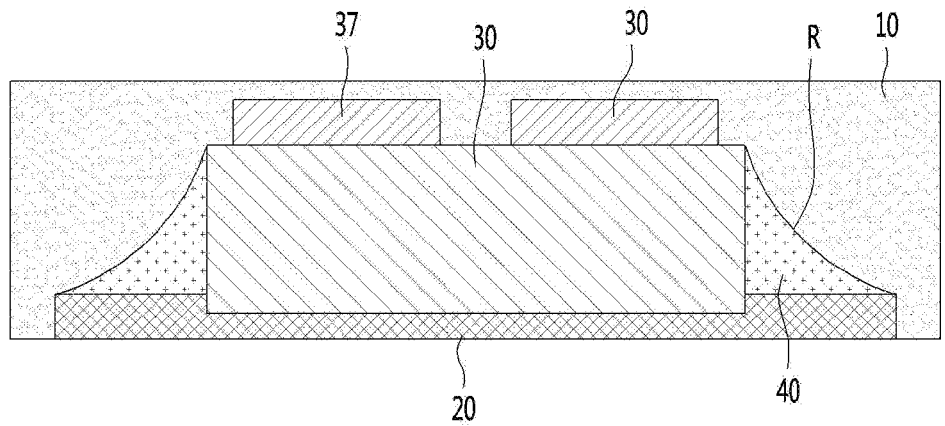

Referring to FIG. 22, the first resin 10 may be disposed around the light emitting device 30 in which the second resin 40 is disposed. The first resin 10 may include at least one of epoxy resin, polyimide resin, urea resin, and acrylic resin, but is not limited thereto. The first resin 10 may include a reflective material. For example, the reflective material may be $TiO_2$ or $SiO_2$, but is not limited thereto. The first resin 10 may include a curvature corresponding to the curvature R of the second resin 40.

Figure 23:
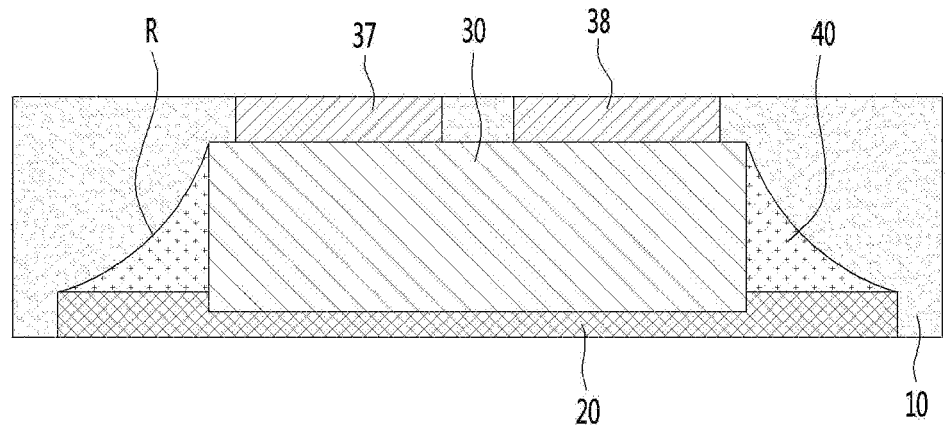

Referring to FIG. 23, The first resin 10 disposed on the upper surface of the first electrode 37 and the second electrode 38 may be polished and the light emitting device may package so that one surface of the first electrode 37 and the second electrode 38 and one surface of the first resin 10 are disposed on the same plane.

Thereafter, the first resin 10 disposed on the first electrode 37 and the second electrode 38 may be removed through a unit package size cutting process and an etching process to complete the light emitting device package.

According to the manufacturing method of the light emitting device package according to the second embodiment, the reliability of the light emitting device package is improved, and a resin may be discolored and cracks may occur as a result of applying a lamination process. In addition, the manufacturing yield of the light emitting device package may be improved through the method of manufacturing the light emitting device package according to the second embodiment.

Figure 24:
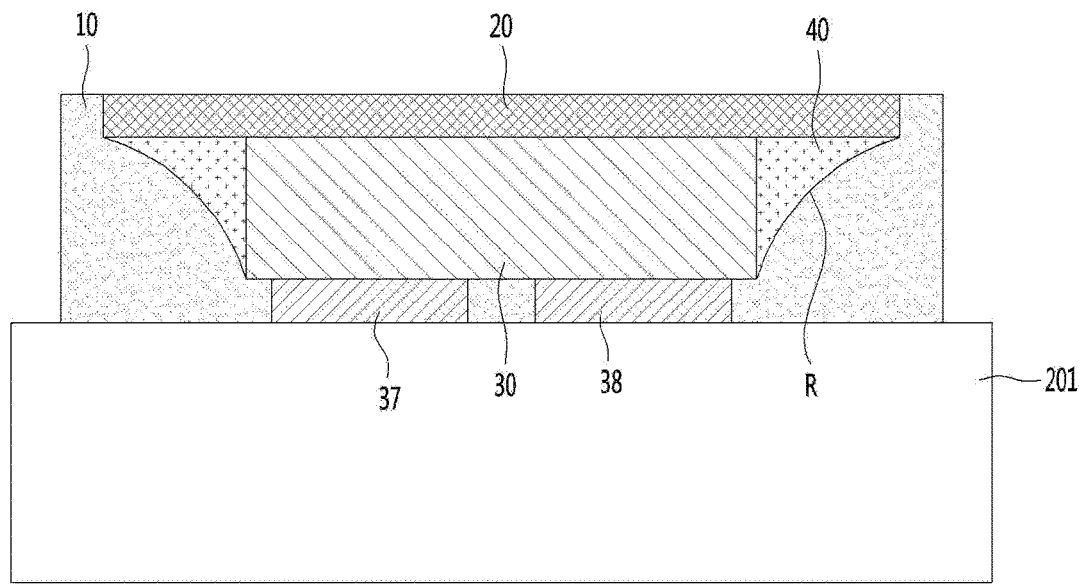
FIG. 24 is an example of a lighting device having the light emitting device package of FIG. 16.

As shown in FIG. 24, the light emitting device package may be disposed in one or plural on the substrate 201. The optical lens disclosed in the first embodiment may be disposed on the light emitting device package. The first and second electrodes of the light emitting device package may be electrically connected to the substrate as in the first embodiment. Since the first resin of the light emitting device package is cured in advance, it may be spaced apart from the upper surface of the substrate 201.

Figure 26:
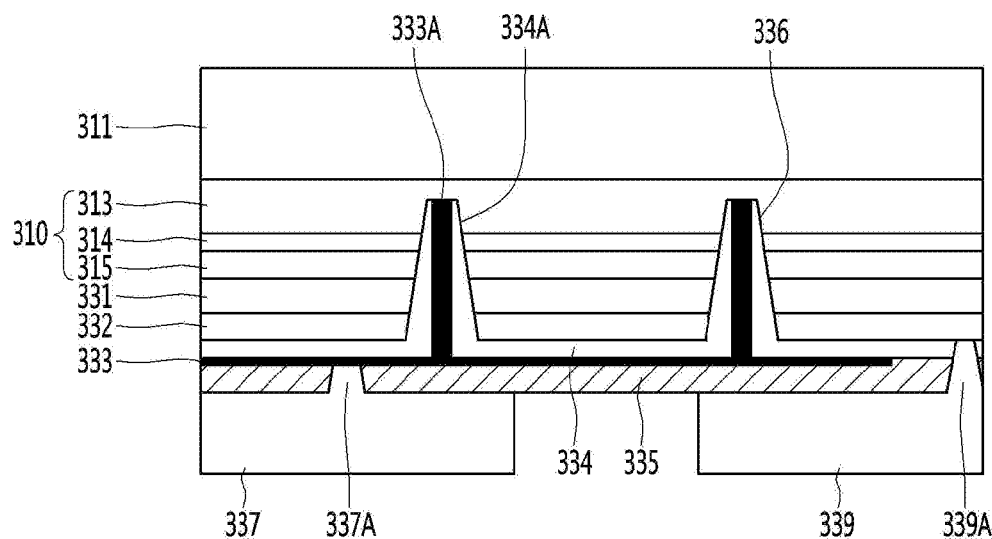
FIG. 26 is another example of a light emitting device of a light emitting device package according to an embodiment of the invention.

FIG. 26 is a view showing an example of a light emitting device in a light emitting device package according to a first or second embodiment of the invention.

Referring to FIG. 26, the light emitting device may include, for example, an LED chip. The light emitting device may emit blue light. The light emitting device includes a transparent substrate 311 and a light emitting structure 310, the transparent substrate 311 is disposed on the light emitting structure 310, and the light emitting structure 310 is disposed on the first and second electrodes 337 and 339.

The transparent substrate 311 may be, for example, a transparent, conductive substrate, or insulating substrate. A plurality of protrusions (not shown) may be formed on the upper and/or lower surfaces of the transparent substrate 311, and each of the plurality of protrusions includes at least one of a lateral cross-section, a hemispherical shape, a polygonal shape, and an elliptical shape and may be arranged in a stripe form or a matrix form. The protrusions may improve light extraction efficiency. Another semiconductor layer, for example, a buffer layer (not shown) may be disposed between the transparent substrate 311 and the first conductivity type semiconductor layer 313, but is not limited thereto. The transparent substrate 311 may be removed, but is not limited thereto.

The light emitting structure 310 includes a first conductivity type semiconductor layer 313, the second conductivity type semiconductor layer 315, and the active layer 314 between the first conductivity type semiconductor layer 313 and 315. Other semiconductor layers may be further disposed on and/or under the active layer 314, but are not limited thereto. The light emitting structure 310 will be referred to the description of the second embodiment disclosed above.

The first and second electrodes 337 and 339 may be disposed under the light emitting structure 310. The first electrode 337 is in electrical contact with the first conductivity type semiconductor layer 313, and the second electrode 339 is in electrical contact with the second conductivity type semiconductor layer 315. The first and second electrodes 337 and 339 may function as a bonding portion.

The first electrode 337 and the second electrode 339 are non-transmissive metals having properties of an ohmic contact, an adhesive layer, and a bonding layer, but are not limited thereto. The first and second electrodes 337 and 339 may have a polygonal or circular shape with a bottom shape. The first electrode 337 may include a branch electrode. The second electrode 339 may include a branch electrode. The branch electrodes connected to the first and second electrodes 337 and 339 may diffuse input current.

The light emitting device includes first and second electrode layers 331 and 332, a third electrode layer 333, and resin layers 334 and 335. Each of the first and second electrode layers 331 and 332 may be formed in a single layer or multiple layers, and may function as a current diffusion layer. The first and second electrode layers 331 and 332 may include a first electrode layer 331 disposed under the light emitting structure 310; and a second electrode layer 332 disposed under the first electrode layer 331. The first electrode layer 331 diffuses current, and the second electrode layer 332 reflects incident light. The recess 336 may expose a portion of the light emitting structure 310 through the first and second electrode layers 331 and 332. Some regions of the light emitting structure 310 may be regions of the first conductivity type semiconductor layer 313.

The first and second electrode layers 331 and 332 may be formed of different materials. The first electrode layer 331 may be formed of a light-transmitting material, for example, metal oxide or metal nitride. The first electrode layer 331 may be selectively formed of, for example, indium tin oxide (ITO), ITO nitride (ITON), indium zinc oxide (IZO), IZO nitride (IZON), indium zinc tin oxide (IZTO), indium aluminum zinc oxide (IZAO), Indium gallium zinc oxide (IGZO), indium gallium tin oxide (IGTO), aluminum zinc oxide (AZO), antimony tin oxide (ATO), or gallium zinc oxide (GZO). The second electrode layer 332 is in contact with the lower surface of the first electrode layer 331 and may function as a reflective electrode layer. The second electrode layer 332 includes metal, such as Ag, Au, or Al. The second electrode layer 332 may partially contact the lower surface of the second conductivity type semiconductor layer 315 when a portion of the first electrode layer 331 is removed.

As another example, the structures of the first and second electrode layers 331 and 332 may be stacked in an Omni Directional Reflector layer (ODR) structure. The Omni Directional Reflective structure may be formed of a stacked structure of the first electrode layer 331 having a low refractive index and the second electrode layer 332 formed of a high reflective metal material contacting the first electrode layer 331. The electrode layers 331 and 332 may be formed of, for example, a stacked structure of ITO/Ag. An omnidirectional reflection angle at the interface between the first electrode layer 331 and the second electrode layer 332 may improve.

As another example, the second electrode layer 332 may be removed, and may be formed of a reflective layer of another material. The reflective layer may be formed of a distributed Bragg reflector (DBR) structure, and the distributed Bragg reflective structure includes a structure in which two dielectric layers having different refractive indices are alternately disposed, and may each include any one of the different from each other of, for example, $SiO_2$ layer, $Si_3N_4$ layer, $TiO_2$ layer, $Al_2O_3$ layer, and MgO layer. As another example, the electrode layers 331 and 332 may include both a distributed Bragg reflective structure and a non-directional reflective structure, and in this case, a light emitting device having a light reflectance of 98% or more may be provided. In the flip-mounted light emitting device, since light reflected from the second electrode layer 332 is emitted through the transparent substrate 311, most of the light may be emitted in the vertical direction.

The third electrode layer 333 is disposed under the second electrode layer 332 and is electrically insulated from the first and second electrode layers 331 and 332. The third electrode layer 333 is a metal, for example, titanium (Ti), copper (Cu), nickel (Ni), gold (Au), chromium (Cr), tantalum (Ta), platinum (Pt), tin (Sn)), Silver (Ag), phosphorus (P). The first electrode 337 and the second electrode 339 are disposed under the third electrode layer 333.

The insulating layers 334 and 335 block unnecessary contact between the first and second electrode layers 331 and 332, the third electrode layer 333, the first and second electrodes 337 and 339, and the layers of the light emitting structure 310. The insulating layers 334 and 335 include first and second insulating layers 334 and 335. The first insulating layer 334 is disposed between the third electrode layer 333 and the second electrode layer 332. The second insulating layer 335 is disposed between the third electrode layer 333 and the first and second electrodes 337 and 339.

The third electrode layer 333 is connected to the first conductivity type semiconductor layer 313. A connection portion 333A of the third electrode layer 333 protrudes into the recesses 336 of the first and second electrode layers 331 and 332 and the light emitting structure 310 and contacts the first conductivity type semiconductor layer 313. Here, the recess 336 may gradually have a narrower width as it is adjacent to the substrate 311. The recess 336 may provide an inclined surface. A plurality of the recesses 336 may be disposed spaced apart from each other. The connecting portion 333A may be disposed in each recess 336. A portion 334A of the first insulating layer 334 extends around the connection portion 333A of the third electrode layer 333 to extend the third electrode layer 333 and the first and second electrode layers 331 and 332. The electrical connection between the second conductivity type semiconductor layer 315 and the active layer 314 is blocked. An insulating layer may be disposed on the side surface of the light emitting structure 310 to protect the side surface, but is not limited thereto.

The second electrode 339 is disposed under the second insulating layer 335 and contacts or connects to at least one of the first and second electrode layers 331 and 332 through the open regions of the first insulating layer 334 and the second insulating layer 335. The first electrode 337 is disposed under the second insulating layer 335 and is connected to the third electrode layer 333 through the open region of the second insulating layer 335. Accordingly, the protrusion 339A of the second electrode 339 is electrically connected to the second conductivity type semiconductor layer 315 through the first and second electrode layers 331 and 332, and the protrusion 337A of the first electrode 337 is electrically connected to the first conductivity type semiconductor layer 313 through the third electrode layer 333.

A plurality of connection portions 333A connected to the first electrode 337 may be disposed to improve current spreading. The first and second electrodes 337 and 339 may be provided under a large area under the light emitting structure 310. The lower surfaces of the first and second electrodes 337 and 339 may be provided with a larger area on the same horizontal surface, so that the adhesion area with the bonding member may be improved. Accordingly, the bonding efficiency of the first and second electrodes 337 and 339 with a bonding member that is a conductive portion may be improved.

Figure 27:
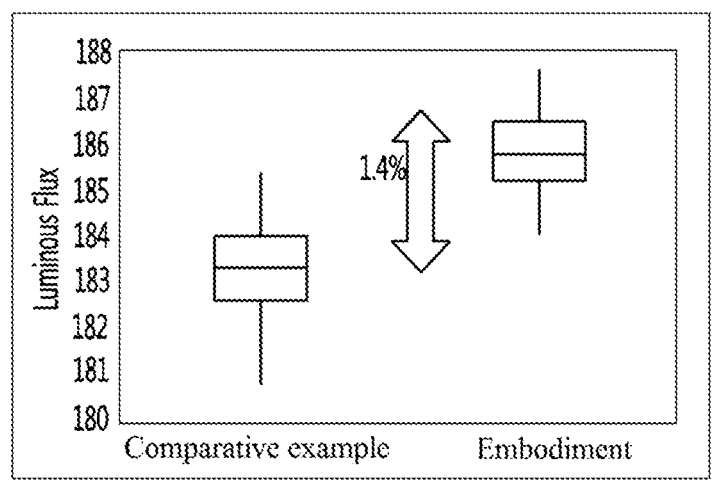
FIG. 27 is a box plot comparing a comparative example and a flux according to the first embodiment.

Referring to FIG. 27, in the light emitting device package according to the first embodiment of the invention, the luminous flux may be improved compared to the comparative example. As shown in FIG. 2, the second resin is a configuration in which the second resin is disposed between the light emitting device and the first resin, and the comparative example is a configuration without the second resin. It may be seen that the package of the first embodiment is improved by 1.4% or more compared to the package of the comparative example.

One or more light emitting device packages according to an embodiment of the invention may be disposed on the circuit board and applied to a light source device. In addition, the light source device may include a display device, a lighting device, a head lamp, etc. according to the industrial field.

As an example of the light source unit, a display device may include a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may have a structure in which light emitting devices that emit red, green and blue light are disposed, respectively.

As still another example of the light source unit, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source unit, the lighting device may include a cover, a light source module, a heat radiator, a power supply, an inner case, and a socket. In addition, the light source unit according to an embodiment may further include at least one of a member and a holder. The light source module may include a light emitting device package according to an embodiment.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light-emitting device package comprising:
   a substrate including first and second frames;
   a light emitting device including a first bonding portion facing the first frame and a second bonding portion facing the second frame;
   a phosphor layer on the light emitting device;
   a first resin disposed around an upper surface of the substrate and the light emitting device;
   a second resin disposed between the first resin and side surfaces of the light emitting device; and
   an adhesive layer between the phosphor layer and the light emitting device,
   wherein an outer portion of the phosphor layer faces the light emitting device and protrudes more outward than a side surface of the light emitting device,
   wherein the adhesive layer includes a thickness thinner than a thickness of the phosphor layer,
   wherein the first resin includes a reflective material and is disposed on a side surface of the phosphor layer,
   wherein the second resin includes a transparent material,
   wherein an outer surface of the second resin facing the first resin includes a curved surface,
   wherein the first and second frames include a plurality of recesses disposed along an outside of each corner of the light emitting device, and
   wherein the plurality of recesses overlaps the first and second resins in a vertical direction.

2. The light-emitting device package of claim 1, wherein the first resin extends between the light emitting device and the substrate on the side surface of the light emitting device,
   wherein the second resin overlaps the outer portion of the phosphor layer in the vertical direction, and
   wherein the second resin is connected to the adhesive layer.

3. The light-emitting device package of claim 1, wherein a maximum thickness of the second resin is greater than a thickness of the light emitting device and smaller than a maximum thickness of the first resin.

4. The light-emitting device package of claim 1, wherein the outer surface of the second resin includes a curved surface convex toward the first resin,
   wherein the convex curved surface of the second resin overlaps each side surface of the light emitting device in a horizontal direction, and
   wherein a center of a virtual circle having the convex curved surface in the second resin is disposed on a region overlapped with the light emitting device in the vertical direction.

5. The light-emitting device package of claim 1, wherein the outer surface of the second resin includes a concave curved surface, and
   wherein a center of a virtual circle having the concave curved surface in the second resin is disposed on a region overlapped with the second resin in a vertical direction.

6. The light-emitting device package of claim 1, wherein the substrate includes a body formed of ceramic material,
   wherein the substrate includes a third frame surrounding the first and second frames around an outer periphery of the first and second frames, a plurality of lower frames on a lower surface of the substrate, and a plurality of connecting members penetrating through the body and connected to the first and second frames, and
   wherein an interval between the plurality of connecting members is greater than a length of one side surface of the light emitting device.

7. The light-emitting device package of claim 1, further comprising:
   an optical lens disposed on the substrate, the phosphor layer, and the first resin,
   wherein the optical lens is attached to the first and second frames and an upper surface of a body of the substrate, and
   wherein an outer side surface of the optical lens is disposed on a same vertical plane as a side surface of the substrate.

8. The light-emitting device package of claim 1, further comprising:
   a transparent third resin between the first resin and the second resin,
   wherein an outer surface of the third resin includes a curved surface convex in an outer direction of the third resin, and
   wherein the third resin contacts the side surface of the phosphor layer.

9. A light-emitting device package comprising:
   a light emitting device comprising first and second electrodes, a light emitting structure on the first and second electrodes, and a transparent substrate on the light emitting structure;
   a phosphor layer disposed on the transparent substrate; and
   a first resin formed of a reflective material and disposed around the light emitting device and the phosphor layer,
   wherein the phosphor layer includes a recess recessed in a direction of an upper surface of the phosphor layer,
   wherein a portion of the transparent substrate of the light emitting device is disposed in the recess,
   wherein the first resin includes an outer region in contact with a side surface of the phosphor layer,
   wherein a horizontal width of the outer region of the first resin ranges from 30 µm to 500 µm,
   wherein the first resin includes a first region disposed on the side surface of the phosphor layer and a second region disposed on a side surface of the light emitting device in a vertical direction,
   wherein a thickness of the first region is smaller than a thickness of the second region,
   wherein the thickness of the first region is in a range of 1:0.3 to 1:0.75 compared to the thickness of the second region,
   wherein a thickness of the recess is in a range of 0.1 to 0.5 compared to a thickness of the phosphor layer, wherein the first electrode and the second electrode of the light emitting device are exposed on a lower surface of the first resin, wherein an upper surface of the first resin extends flat outwardly from the upper surface of the phosphor layer, and wherein a lower surface of the first electrode of the light emitting device and a lower surface of the second electrode are disposed in a same plane as the lower surface of the first resin.

10. The light-emitting device package of claim 9, wherein an outer side surface of the first resin is disposed in a plane perpendicular to the upper surface of the phosphor layer.

11. The light-emitting device package of claim 9, wherein an upper surface of the transparent substrate is higher than the lower surface of the phosphor layer.

12. The light-emitting device package of claim 11, wherein an upper surface of the transparent substrate is higher than the upper surface of the first resin disposed on the side surface of the light emitting device.

13. A light-emitting device package comprising:
a substrate including first and second frames;
a light emitting device including a first bonding portion facing the first frame and a second bonding portion facing the second frame;
a phosphor layer on the light emitting device;
a first resin disposed around an upper surface of the substrate and the light emitting device;
a second resin disposed between the first resin and side surfaces of the light emitting device; and
an optical lens disposed on the phosphor layer and the substrate and having a convex curved surface; and
an adhesive layer between the phosphor layer and the light emitting device,
wherein an outer portion of the phosphor layer faces the light emitting device and protrudes more outward than a side surface of the light emitting device,
wherein the adhesive layer includes a thickness thinner than a thickness of the phosphor layer,
wherein the first resin includes a reflective material and is disposed on a side surface of the phosphor layer,
wherein the second resin includes a transparent material,
wherein an outer surface of the second resin faces the first resin and includes a curved surface,
wherein the optical lens is in contact with the first resin, the first frame and the second frame of the substrate,
wherein the first and second frames include a plurality of recesses disposed along an outside of each corner of the light emitting device, and
wherein the plurality of recesses overlaps the first and second resin in a vertical direction.

14. The light-emitting device package of claim 13, wherein one of the plurality of recesses has a length greater than a length of one side of the light emitting device.

15. The light-emitting device package of claim 13, wherein the first resin extends between the light emitting device and the substrate on the side surface of the light emitting device, wherein the first resin extends from the side surface of the phosphor layer to the upper surface of the substrate, wherein the second resin is connected to the adhesive layer, and wherein a maximum thickness of the second resin is greater than a thickness of the light emitting device and smaller than a maximum thickness of the first resin.

16. The light-emitting device package of claim 13, wherein the outer surface of the second resin includes a curved surface convex toward the first resin, wherein the convex curved surface of the first resin overlaps each side surface of the light emitting device in a horizontal direction, wherein a center of a virtual circle having the convex curved surface in the second resin is disposed on a region overlapped with the light emitting device in a vertical direction, wherein the substrate includes a body made of ceramic material, wherein the substrate is a third frame surrounding the first and second frames around an outer periphery of the first and second frames, a plurality of lower frames on a lower surface of the substrate, and a plurality of connecting members penetrating through the body and connected to the first and second frames, and wherein an interval between the plurality of connecting members is greater than a length of one side surface of the light emitting device.

17. The light-emitting device package of claim 13, wherein the outer surface of the second resin includes a concave curved surface, wherein a center of a virtual circle having the concave curved surface in the second resin is disposed on a region overlapped with the second resin in a vertical direction, wherein the substrate includes a body made of ceramic material, wherein the substrate is a third frame surrounding the first and second frames around an outer periphery of the first and second frames, a plurality of lower frames on a lower surface of the substrate, and a plurality of connecting members penetrating through the body and connected to the first and second frames, and wherein an interval between the plurality of connecting members is greater than a length of one side surface of the light emitting device.

18. The light-emitting device package of claim 13, further comprising:
a protective device disposed outside a region of the second resin,
wherein the protective device is disposed on the first frame of the light emitting device and connected to the second frame with a connecting member.

* * * * *